(12) United States Patent
Yamanaka

(10) Patent No.: US 8,013,416 B2
(45) Date of Patent: Sep. 6, 2011

(54) SEMICONDUCTOR DEVICE

(75) Inventor: Takamitsu Yamanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 577 days.

(21) Appl. No.: 10/577,457

(22) PCT Filed: Aug. 3, 2005

(86) PCT No.: PCT/JP2005/014208
§ 371 (c)(1),
(2), (4) Date: Apr. 27, 2006

(87) PCT Pub. No.: WO2006/018974
PCT Pub. Date: Feb. 23, 2006

(65) Prior Publication Data
US 2006/0289947 A1 Dec. 28, 2006

(30) Foreign Application Priority Data

Aug. 17, 2004 (JP) ................. 2004-237207
Aug. 17, 2004 (JP) ................. 2004-237208
Aug. 17, 2004 (JP) ................. 2004-237209
Aug. 17, 2004 (JP) ................. 2004-237210
Aug. 17, 2004 (JP) ................. 2004-237211

(51) Int. Cl.
*H01L 21/70* (2006.01)
(52) U.S. Cl. .................. 257/500; 257/501; 257/502
(58) Field of Classification Search .......... 257/409, 257/506, 509, 510, 500–502; 438/212, 981, 438/275, 770–774, 425, 297, 221
See application file for complete search history.

(56) References Cited

U.S. PATENT DOCUMENTS

| 5,236,861 | A | 8/1993 | Otsu | |
|---|---|---|---|---|
| 5,760,440 | A | 6/1998 | Kitamura et al. | |
| 6,136,643 | A * | 10/2000 | Jeng et al. | 438/253 |
| 6,780,717 | B2 * | 8/2004 | Yasuoka et al. | 438/276 |
| 7,141,862 | B2 * | 11/2006 | Noda et al. | 257/500 |
| 2001/0023107 | A1 | 9/2001 | Hong et al. | |
| 2002/0025632 | A1 | 2/2002 | Hayashi et al. | |
| 2003/0022460 | A1 | 1/2003 | Park | |

FOREIGN PATENT DOCUMENTS

| JP | 60-137024 | 7/1985 |
|---|---|---|
| JP | 5-47919 | 2/1993 |
| JP | 05-082637 | 4/1993 |
| JP | 06-029525 | 2/1994 |

(Continued)

*Primary Examiner* — N Drew Richards
*Assistant Examiner* — Jae Lee
(74) *Attorney, Agent, or Firm* — Rabin & Berdo, PC

(57) ABSTRACT

This semiconductor device includes a first device and a second device provided on a semiconductor substrate and having different breakdown voltages. More specifically, the semiconductor device includes a semiconductor substrate, a first region defined on the semiconductor substrate and having a first device formation region isolated by a device isolation portion formed by filling an insulator in a trench formed in the semiconductor substrate, a first device provided in the first device formation region, a second region defined on the semiconductor substrate separately from the first region and having a second device formation region, and a second device provided in the second device formation region and having a higher breakdown voltage than the first device, the second device having a drift drain structure in which a LOCOS oxide film thicker than a gate insulation film thereof is disposed at an edge of a gate electrode thereof.

5 Claims, 17 Drawing Sheets

FOREIGN PATENT DOCUMENTS

| | | |
|---|---|---|
| JP | 06-268162 | 9/1994 |
| JP | 07-283302 | 10/1995 |
| JP | 8-227998 | 9/1996 |
| JP | 10-135448 | 5/1998 |
| JP | 10-284615 | 10/1998 |
| JP | 2002-76288 | 3/2002 |
| JP | 2003-60025 | 2/2003 |
| JP | 2004-296754 | 10/2004 |

* cited by examiner

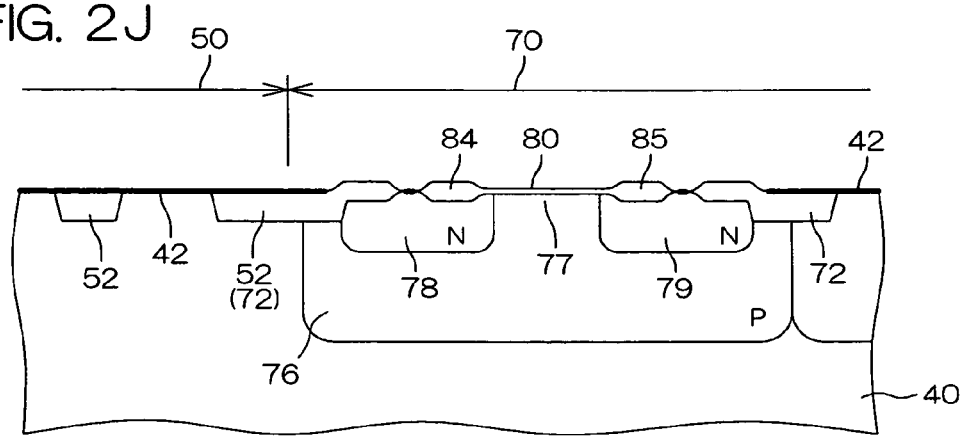
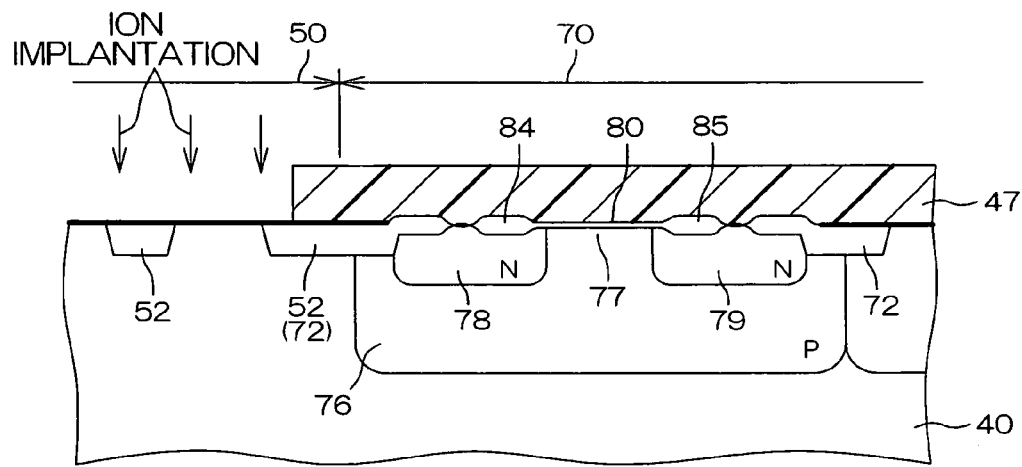
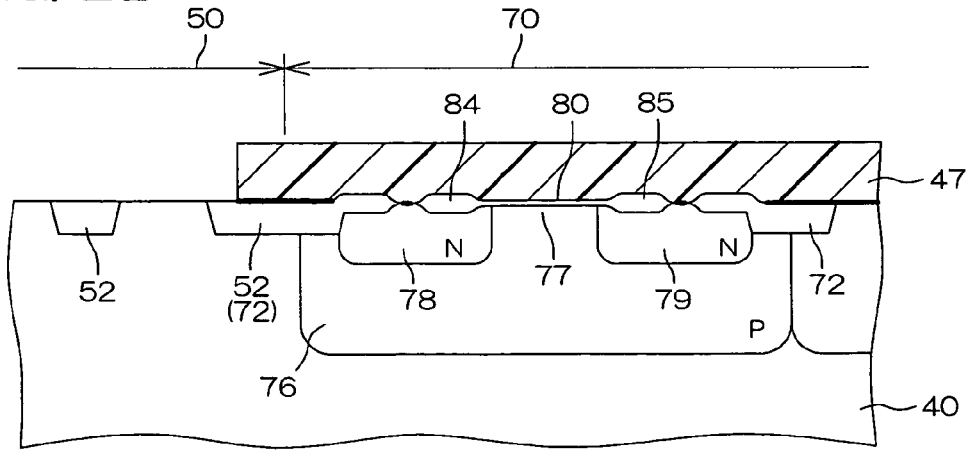

US 8,013,416 B2

SEMICONDUCTOR DEVICE

TECHNICAL FIELD

The present invention relates to a semiconductor device in which a plurality of devices having different breakdown voltages are mounted on the same semiconductor substrate, and a production method therefor. The invention further relates to a production method for a semiconductor device having a first region and a second region (e.g., a lower breakdown voltage region and a higher breakdown voltage region) provided on a semiconductor substrate. The invention further relates to a production method for a semiconductor device having at least three types of oxide films having different thicknesses on a semiconductor substrate. The invention further relates to a production method for a semiconductor device having a trench filled with silicon oxide in the vicinity of a channel region. The invention further relates to a production method for a semiconductor device having a transistor of a drift drain structure in which an oxide film thicker than a gate oxide film thereof is provided at an edge of a gate electrode thereof.

BACKGROUND ART

Semiconductor devices such as an integrated circuit for driving a liquid crystal display panel (driver IC) and an integrated circuit for controlling auto-focusing of a digital still camera or the like (auto-focus IC) often include plural kinds of transistor devices (typically MOS FET transistors) having different breakdown voltages on a semiconductor substrate. Such a semiconductor device has, for example, a lower breakdown voltage region formed with a lower breakdown voltage transistor and a higher breakdown voltage region formed with a higher breakdown voltage transistor on the semiconductor substrate.

Isolation of device regions to be formed with the respective transistor devices is achieved by a LOCOS (local oxidation of silicon) method or an STI (shallow trench isolation) method. In the LOCOS method, a thermal oxide film is selectively grown on a surface of a silicon substrate for the isolation of the device regions. In the STI method, on the other hand, an insulating material (e.g., silicon oxide) is filled in a shallow trench (having a depth of about 4000 Å) formed in a silicon substrate for the isolation of the device formation regions.

For the semiconductor device including both the lower breakdown voltage region and the higher breakdown voltage region provided on the semiconductor substrate, it is a conventional practice to equally apply the LOCOS method to the respective regions (e.g., Japanese Unexamined Patent Publication Nos. HEI10-284615 (1998) and 2002-76288) or equally apply the STI method to the respective regions.

However, the application of the LOCOS method to the lower breakdown voltage region hinders microminiaturization of the device in the lower breakdown voltage region. On the other hand, the application of the STI method to the higher breakdown voltage region reduces the breakdown voltage due to remarkable concentration of the electric field on an edge of the trench.

More specifically, the MOS transistor of a higher breakdown voltage has a drift drain structure in which an oxide film thicker than a gate oxide film thereof is provided at an edge of a gate electrode thereof for alleviating the concentration of the electric field on the edge of the gate electrode. The thicker oxide film is formed as a LOCOS oxide film if the device isolation structure is provided by the LOCOS method, or formed as an STI portion if the device isolation structure is provided by the STI method. Where the thicker oxide film is formed as the STI portion, the electric field is liable to concentrate on an edge of the STI portion (an edge of the trench) located immediately below the edge of the gate electrode.

In the LOCOS method, on the other hand, a nitride film is formed on the surface of the silicon substrate with the intervention of a pad oxide film, and a resist film pattern is formed on the nitride film. The nitride film is etched by a reactive ion etching process using the resist film as a mask, whereby an opening is formed in the nitride film in association with a LOCOS oxide film formation region. After the resist film is removed, a thermal oxidation process is performed by using the nitride film as an oxidation resistant mask, whereby the thicker LOCOS oxide film grows in the opening of the nitride film. Thereafter, the nitride film is wet-etched by a hot phosphoric acid solution, and the pad oxide film is removed. Then, a thin gate oxide film is formed in a region isolated by the LOCOS oxide film.

However, the gate oxide film of the transistor provided in the lower breakdown voltage region and the gate oxide film of the transistor provided in the higher breakdown voltage region have completely different thicknesses. Therefore, the gate oxide film of the higher breakdown voltage transistor and the gate oxide film of the lower breakdown voltage transistor should be formed in separate steps.

That is, the thermal oxidation process should be performed selectively on the higher breakdown voltage region with the lower breakdown voltage region covered with the oxidation resistant mask when the gate oxide film of the higher breakdown voltage transistor is formed.

However, the hot phosphoric acid solution to be used for the removal of the nitride film serving as the oxidation resistant mask in the LOCOS method also dissolves the resist film. Therefore, the nitride film on the semiconductor substrate is completely removed by the wet etching process using the hot phosphoric acid solution, and the oxidation resistant mask in the lower breakdown voltage region is lost.

An alternative conceivable approach to the etching of the nitride film is to employ reactive ion etching. That is, a portion of the nitride film on the channel region is selectively dry-etched with the lower breakdown voltage region covered with the resist film.

Where the removal of the nitride film portion on the channel region is achieved by the reactive ion etching, however, the channel region is inevitably damaged by plasma. Therefore, if the gate oxide film is formed on the channel region thus damaged, it is impossible to provide a highly reliable gate oxide film, so that the transistor fails to have desired characteristics.

Where the STI (shallow trench isolation) method is employed for the isolation of the device regions, the aforementioned problems occur because the formation of the gate oxide film is achieved by the thermal oxidation method.

A specific example employing the LOCOS method is shown in FIGS. 10(a) to 10(d). As shown in FIG. 10(a), a thick LOCOS oxide film 3 is formed to isolate a lower breakdown voltage device region 4 and a higher breakdown voltage device region 5 by a selective thermal oxidation process using a nitride film pattern 2 formed on a semiconductor substrate 1 as a mask. Then, the nitride film 2 is removed and the thermal oxidation process is further performed, whereby a gate oxide film 6 is formed in the higher breakdown voltage device region 5 as shown in FIG. 10(b). At this time, an oxide film 6a grows in the lower breakdown voltage device region 4 in the same manner. As shown in FIG. 10(c), a resist film 7 is formed as having a pattern which covers the higher breakdown voltage device region 5 and uncovers the lower breakdown voltage device region 4, and the oxide film 6a (a hatched portion)

in the lower breakdown voltage region 4 is removed by a fluoric acid solution with the use of the resist film 7 as a mask. In turn, as shown in FIG. 10(d), a gate oxide film 8 for the lower breakdown voltage device region 4 is formed by performing a thermal oxidation process after removing the resist film 7.

Thus, the three types of oxide films having different thicknesses, i.e., the LOCOS oxide film 3, the gate oxide film 6 thinner than the LOCOS oxide film 3, and the gate oxide film 8 thinner than the gate oxide film 6, are formed.

It would be ideal that the resist film 7 could be aligned with an edge of the lower breakdown voltage device region 4 isolated by the LOCOS oxide film 3, but the edge of the lower breakdown voltage device region 4 is present on the LOCOS oxide film 3 because a mask alignment margin should be taken into consideration. Therefore, the LOCOS oxide film is eroded during the wet etching as shown in FIG. 10(c), whereby a step 9 is formed.

This reduces the thickness of a part of the LOCOS oxide film 3, thereby causing deterioration of a device isolation breakdown voltage. This problem may be avoided by increasing the thickness of the LOCOS oxide film 3. However, this increases a bird's beak of the LOCOS oxide film 3, thereby sacrificing device size controllability.

Further, the step 9 is liable to reduce a focus margin for lithography to be performed in a later step, causing a problem associated with micro-processing.

FIGS. 11 and 12 are a schematic sectional view and a schematic plan view, respectively, for explaining the construction of a semiconductor device having a transistor of a drift drain structure. A pair of drift layers 103 are provided on opposite sides of a channel region 102 in a semiconductor substrate 101. A shallow trench 104 is partly located in surface portions of the drift layers 103 adjacent to the channel region 102. The trench 104 is filled with silicon oxide 105. A gate oxide film 106 is provided on a surface of the channel region 102. A gate electrode 107 (indicated by a two-dot-and-dash line in FIG. 12) is provided on the gate oxide film 106, and an edge portion of the gate electrode 107 reaches an upper surface of the silicon oxide 105. With this arrangement, the concentration of an electric field on the edge of the gate electrode 107 can be alleviated.

As shown in FIG. 12, the trench 104 is also located on opposite sides of the channel region 104 with respect to a widthwise direction W to provide an isolation structure for isolation of the transistor from other devices provided on the semiconductor substrate 101 (so-called shallow trench isolation).

FIGS. 13(a) to 13(f) are schematic sectional views illustrating the trench 104 on an enlarged scale for explaining a production process for the semiconductor device. As shown in FIG. 13(a), the trench 104 is formed by etching the semiconductor substrate 101 by reactive ion etching (RIE) using a silicon nitride film 111 as a hard mask. Thereafter, as shown in FIG. 13(b), a silicon oxide film 112 is formed on the entire surface of the resulting semiconductor substrate by a CVD (chemical vapor deposition) method. Then, as shown in FIG. 13(c), a planarization process is performed by a CMP (chemical mechanical polishing) method to expose the silicon nitride film 111, whereby silicon oxide 105 is buried in the trench 104.

In turn, as shown in FIG. 13(d), the silicon nitride film 111 is removed. Then, a diffusion process for formation of the drift regions 103 and other processes are performed. After each of the processes, the semiconductor substrate 101 is subjected to a cleaning process (light etching process) with the use of fluoric acid. Therefore, the thickness of the silicon oxide film 112 is reduced. The thickness reduction progresses isotropically, and the semiconductor substrate 101 is not soluble at all in fluoric acid. Therefore, the edge of the silicon oxide 105 is recessed inward of the edge of the trench 104 as shown in FIG. 13(e) before formation of the gate oxide film 106, so that a recess (divot) 113 (indicated by a bold line in FIG. 12) is formed on a boundary of the channel region 102.

In this state, the gate oxide film 106 is formed as shown in FIG. 13(f), and the gate electrode 107 is formed as extending from the channel region 102 to the upper side of the trench 104.

Therefore, the gate oxide film 106 has a thinner film portion 106a having a smaller thickness than other portions thereof on a boundary of the trench 104, i.e., on the edge of the channel region 104. The thinner film portion 106a causes reduction of the breakdown voltage of the gate oxide film and deterioration of static characteristics of the transistor (e.g., a hump which causes an unstable threshold).

FIGS. 14(a) to 14(d) schematically illustrate a production method for producing the semiconductor device having the transistor of the drift drain structure by employing the LOCOS method. As shown in FIG. 14(a), a nitride film 202 is formed on a semiconductor substrate 201, and patterned by using a resist film 210 as a mask. The nitride film 202 has a pair of openings 202a formed on opposite sides of a channel region 203. As shown in FIG. 14(b), LOCOS oxide films 204 are formed in a surface of the semiconductor substrate 201 by thermal oxidation with the use of the nitride film 202 as an oxidation resistant mask.

In turn, as shown in FIG. 14(c), a P-type well 205 is formed in the substrate by implanting ions and thermally diffusing (driving) the implanted ions after removing the nitride film 202. Further, a resist film 206 is formed as covering the channel region 203 and a portion of the substrate not formed with the well 205, and N-type impurity ions are implanted into the substrate by using the resist film 206 as a mask.

Thereafter, as shown in FIG. 14(d), the resist film 206 is peeled off, and the implanted N-type impurity ions are thermally diffused, whereby a pair of drift layers 207 are formed on the opposite sides of the channel region 203. The drift layers 207 extend to the channel region 203 below the LOCOS oxide films 204 on the opposite sides of the channel region 203. A thin gate oxide film 208 is formed in a surface portion of the semiconductor substrate 201 on the channel region 203 by a thermal oxidation method. The gate oxide film 208 is connected to the LOCOS oxide films 204. In this state, a gate electrode 209 is formed as covering an upper surface of the gate oxide film 208 and extending to upper surfaces of the LOCOS oxide films 204. Thus, an edge of the gate electrode 209 is located on the LOCOS oxide films 204 which are thicker than the gate oxide film 208, so that the concentration of an electric field on the edge of the gate electrode 209 can be alleviated.

However, the aforementioned production method suffers from a problem that an intrusion distance X by which the drift layers 207 each intrude into the channel region 203 from an inner edge of the LOCOS oxide film 204 varies. The variation in the intrusion distance X is attributable to misalignment (mask misalignment) between the resist film 210 as the mask for the patterning of the nitride film 202 and the resist film 206 as the mask for the formation of the drift layers 207. Therefore, the intrusion distance X varies depending on a wafer (semiconductor substrate 201) and also varies depending on an in-plane position on the same wafer.

As shown in FIG. 15, the intrusion distance X significantly influences the breakdown voltage of the transistor (BVdss: breakdown voltage of drain with source short). As can be understood from FIG. 15, the breakdown voltage is stabilized by increasing the intrusion distance X. However, a design having a greater intrusion distance X fails to satisfy the demand for the microminiaturization of the transistor, and merely provides a lower breakdown voltage. Therefore, it is desirable to reduce the intrusion distance X as much as possible and to minimize the variations.

SUMMARY OF THE INVENTION

It is a first object of the present invention to provide a semiconductor device which has a plurality of regions of different breakdown voltages provided on a semiconductor substrate, wherein a device in a lower breakdown voltage region is allowed to have a microminiaturized structure and a device in a higher breakdown voltage region is allowed to have a sufficient breakdown voltage, and to provide a production method for the semiconductor device.

It is a second object of the present invention to provide a method for producing a highly reliable semiconductor device by selectively removing a nitride film within a predetermined region on a semiconductor substrate while suppressing damages to the region.

It is a third object of the present invention to provide a production method which ensures proper formation of at least three types of oxide films having different thicknesses on a semiconductor substrate, thereby improving the characteristic properties of a semiconductor device.

It is a fourth object of the present invention to provide a semiconductor device production method which prevents reduction of the thickness of a gate oxide film on a boundary between a channel region and a trench and improves the breakdown voltage of the gate oxide film and the characteristic properties of a semiconductor device.

It is a fifth object of the present invention to provide a semiconductor device production method which suppresses a breakdown voltage variation which may occur when an attempt is made to increase the breakdown voltage of a transistor of a drift drain structure and to microminiaturize the transistor.

A semiconductor device according to a first aspect of the present invention comprises: a semiconductor substrate; a first region defined on the semiconductor substrate and having a first device formation region isolated by a device isolation portion formed by filling an insulator in a trench formed in the semiconductor substrate; a first device provided in the first device formation region; a second region defined on the semiconductor substrate separately from the first region and having a second device formation region; and a second device provided in the second device formation region and having a higher breakdown voltage than the first device, the second device having a drift drain structure in which a LOCOS oxide film thicker than a gate insulation film thereof is disposed at an edge of a gate electrode thereof.

With this arrangement, so-called shallow trench isolation (STI) is employed for the device isolation in the first region formed with the first device of the lower breakdown voltage, so that the microminiaturization of the structure in the first region can be advantageously achieved. On the other hand, the second device of the higher breakdown voltage formed in the second region has the drift drain structure with the LOCOS oxide film provided at the edge of the gate electrode, so that the problem of the concentration of the electric field can be suppressed which may otherwise occur when a thick insulation film of an STI portion is disposed on the edge of the gate electrode. Thus, the second device has a sufficient breakdown voltage.

The second device formation region is preferably a region isolated by a device isolation portion formed by filling an insulator in a trench formed in the semiconductor substrate. With this arrangement, the device formation region in the second region is isolated by an STI portion as in the first region, so that the isolation structures in the device formation regions in the first and second regions can be formed in the same step. Thus, the production is facilitated.

The second device formation region may be a region isolated by a LOCOS oxide film. With this arrangement, the LOCOS method is employed for the isolation of the device formation region in the second region, so that the concentration of the electric field in the second region can be further suppressed. Thus, this arrangement is further advantageous for increasing the breakdown voltage.

The first device may have a smaller device size than the second device. As described above, the STI method advantageous for the microminiaturization of the device is employed for the isolation of the device formation region in the first region, so that the microminiaturization of the first device can be easily achieved.

A production method for producing the aforesaid semiconductor device comprises the steps of: forming a device isolation portion in a first region on a semiconductor substrate by filling an insulator in a trench formed in the semiconductor substrate to define a first device formation region isolated by the device isolation portion; defining a second device formation region in a second region different from the first region on the semiconductor substrate; forming a first device in the first device formation region; and forming a second device having a higher breakdown voltage than the first device in the second device formation region, the second device having a drift drain structure in which a LOCOS oxide film thicker than a gate insulation film thereof is disposed at an edge of a gate electrode thereof.

A semiconductor device production method according to a second aspect of the present invention comprises the steps of: forming a nitride film which entirely covers a first region on a semiconductor substrate and covers a predetermined region of a second region on the semiconductor substrate; forming an oxide layer on the entire surface of the nitride film; forming a resist film above the nitride film after the oxide layer forming step, the resist film having a pattern which covers the first region and uncovers a predetermined oxide film formation region in the second region; selectively removing a portion of the oxide layer formed on the surface of the nitride film in the oxide film formation region by wet etching with a fluoric acid solution by using the resist film as a mask to uncover a portion of the nitride film underlying the oxide layer portion; removing the resist film; removing the uncovered portion of the nitride film by a phosphoric acid solution heated at a predetermined temperature higher than a room temperature; and forming an oxide film by thermal oxidation in a surface portion of the semiconductor substrate in the oxide film formation region freed of the nitride film.

This method is based on the fact that the rate of the etching with the fluoric acid solution is higher for the oxide layer than for the nitride film, and the rate of the etching with the hot phosphoric acid solution is higher for the nitride film than for the oxide film. That is, after the formation of the nitride film in the first and second regions on the semiconductor substrate, the oxide layer is formed on the entire surface of the nitride film, and the oxide layer portion present on the to-be-removed nitride film portion (in the oxide film formation region) in the second region is selectively removed by the etching with the fluoric acid solution. Therefore, when the etching with the hot phosphoric acid solution is thereafter performed, only the nitride film portion (in the oxide film formation region) freed of the oxide layer is selectively removed. Since dry etching is not employed for the selective removal of the nitride film, it is possible to grow the oxide film in the surface of the semiconductor substrate free from damages after the removal of the nitride film portion by the wet etching.

The method preferably further comprises the steps of forming a first device in the first region and forming a second device having a higher breakdown voltage than the first device in the second region. According to this method, it is possible to grow the oxide film in the oxide film formation region free from damages in the second region for the formation of the second device of a higher breakdown voltage, while protecting the first region to be formed with the first device of a lower breakdown voltage by the nitride film.

Where the first device and the second device each have a gate oxide film and the gate oxide film of the first device has a smaller thickness than the gate oxide film of the second device, for example, it is possible to form the thinner gate oxide film for the first device by highly accurately controlling the thickness of the thinner gate oxide film after forming the gate oxide film for the second device with the first region protected by the nitride film. This allows the first device to have a microminiaturized structure and allows the second device to have a sufficient breakdown voltage.

The oxide film formation region in the second region may include a channel region of a transistor. According to this method, it is possible to remove a portion of the nitride film on the channel region of the transistor without performing dry etching which may damage the channel region, and to form the oxide film (e.g., a gate oxide film) on the channel region. Thus, the second device can be provided as having excellent characteristics.

A semiconductor device production method according to a third aspect of the present invention, as shown in FIGS. 8(*a*) to 8(*f*) by way of example, comprises the steps of: forming a nitride film 22 on a semiconductor substrate 21, the nitride film 22 having an opening in a first oxide film formation region 31 and covering a second oxide film formation region 32 and a third oxide film formation region 33 (FIG. 8(*a*)); forming a first oxide film 23 (a LOCOS oxide film for isolation of a device formation region in the example shown in FIGS. 8(*a*) to 8(*f*)) having a first thickness in the first oxide film formation region 31 by performing a thermal oxidation process on the semiconductor substrate 21 by using the nitride film 22 as a oxidation resistant mask (FIG. 8(*b*)); forming an oxide layer 24 which covers a surface of the nitride film 22 (FIG. 8(*b*)); forming a resist film 25 on the resulting semiconductor substrate 21, the resist film 25 having an opening in the second oxide film formation region 32 and covering the third oxide film formation region 33 (FIG. 8(*c*)); removing a portion of the oxide layer 24 covering the surface of the nitride film 22 in the second oxide film formation region 32 by wet etching with a fluoric acid solution by using the resist film 25 as a mask (FIG. 8(*c*) removing the resist film 25 (FIG. 8(*d*)); removing a portion of the nitride film 22 freed of the oxide layer 24 in the second oxide film formation region 32 by wet etching with a phosphoric acid solution at a temperature higher than a room temperature (FIG. 8(*d*)); forming a second oxide film 26 (e.g., a gate oxide film for a transistor) having a second thickness smaller than the first thickness in a region of the second oxide film formation region 32 freed of the nitride film 22 by thermal oxidation (FIG. 8(*d*)); removing a portion of the oxide layer 24 covering the surface of the nitride film 22 in the third oxide film formation region 33 by wet etching with a fluoric acid solution (FIG. 8(*e*)); removing a portion of the nitride film 22 freed of the oxide layer 24 in the third oxide film formation region 33 by wet etching with a phosphoric acid solution at a temperature higher than the room temperature (FIG. 8(*f*)); and forming a third oxide film 27 (e.g., a gate oxide film for a transistor) having a third thickness smaller than the second thickness in a region of the third oxide film formation region 33 freed of the nitride film 22 by thermal oxidation (FIG. 8(*f*)).

According to this method, the first oxide film of the first thickness is formed in the first oxide film formation region by using the nitride film formed on the semiconductor substrate as the oxidation resistant mask. Simultaneously therewith or thereafter, the oxide layer is formed on the surface of the nitride film. The oxide layer is susceptible to the etching with the fluoric acid solution, but substantially insusceptible to the etching with the hot phosphoric acid solution. The oxide layer portion on the surface of the nitride film in the second oxide film formation region is removed by the fluoric acid solution. Since the resist film is not resistant to the hot phosphoric acid solution, the nitride film portion freed of the oxide layer is selectively removed by peeling off the resist film and then performing the etching with the hot phosphoric acid solution. In this state, the thermal oxidation is performed by using the remaining nitride film as the oxidation resistant mask, whereby the second oxide film having the second thickness smaller than the first thickness is formed in the second oxide film formation region.

After the oxide layer portion on the surface of the nitride film in the third oxide film formation region is removed and the nitride film is removed by the etching with the phosphoric acid solution, the thermal oxidation is performed, whereby the third oxide film having the third thickness smaller than the second thickness is formed in the third oxide film formation region.

Thus, the thickness of the thinnest third oxide film can be accurately controlled without influences of the first oxidation film forming step and the second oxide film forming step, and the thickness of the second thinnest second oxide film can be accurately controlled without an influence of the first oxide film forming step.

Unlike a case in which a thick oxide film is formed on the entire substrate and partly etched away and then a thinner oxide film is formed in a predetermined region, no step is formed in the previously formed thick oxide film (the first oxide film in the example shown in FIGS. 8(*a*) to 8(*f*)). Thus, a focus margin can be improved in a lithography process to be performed later. Where the thick oxide film (the first oxide film in the example shown in FIGS. 8(*a*) to 8(*f*)) serves as a film (LOCOS oxide film) for the device isolation, the problem of the reduction of the device isolation breakdown voltage attributable to the thickness reduction of the oxide film can be avoided.

The oxide layer has a very small thickness (e.g., about 150 Å) which is sufficient for the prevention of the etching of the nitride film with the hot phosphoric acid solution. There is no possibility of the unwanted thickness reduction of the previously formed oxide film during the etching of the oxide layer. Hence, the thicknesses of the first, second and third oxide films are determined without consideration of the thickness reduction of the oxide films but in consideration of required characteristics alone.

The method preferably further comprises the steps of forming a first transistor having a gate oxide film defined by the third oxide film and forming a second transistor having a gate oxide film defined by the second oxide film and having a higher breakdown voltage than the first transistor. According to this method, it is possible to form both the higher breakdown voltage transistor and the lower breakdown voltage transistor on the semiconductor substrate and to accurately control the thickness of the gate oxide film of the lower breakdown voltage transistor. Thus, the higher breakdown voltage transistor has a sufficient breakdown voltage, while the lower breakdown voltage transistor has excellent characteristics.

The first oxide film is preferably an oxide film located at an edge of a gate electrode of the second transistor and having a greater thickness than the second oxide film defined as the gate oxide film of the second transistor. According to this method, a drift drain structure is provided in which the concentration of the electric field is prevented by locating the thick oxide film at the edge of the gate electrode, and the second transistor is allowed to have higher breakdown voltage characteristics.

The first oxide film may include a LOCOS oxide film which isolates a device formation region on the semiconductor substrate. According to this method, the higher breakdown voltage transistor and the lower breakdown voltage transistor can be formed on the semiconductor substrate with device formation regions therefor being isolated by the LOCOS oxide film having no step.

A semiconductor device production method according to a fourth aspect of the present invention comprises the steps of: forming a trench adjacent to a channel region in a semiconductor substrate; filling an oxide film in the trench; forming an oxidation resistant mask film which covers the channel region as protruding by a predetermined distance on the trench and uncovers a portion of the oxide film in the trench adjacent to a boundary between the channel region and the trench; performing a selective thermal oxidation process by using the oxidation resistant mask film as a mask to cause a bird's beak to grow as extending from the trench to the channel region; and forming a gate oxide film on the channel region after the selective thermal oxidation step.

According to this method, the selective thermal oxidation is performed by using as the mask the oxidation resistant mask film which protrudes by the predetermined distance over the channel region and uncovers the oxide film portion adjacent to the boundary between the channel region and the trench before the formation of the gate oxide film. Thus, the bird's beak extends from the oxide film in the trench to the channel region, so that a recess is not formed in the oxide film on the boundary between the trench and the channel region. Therefore, when the gate oxide film is thereafter formed, the gate oxide film has a uniform thickness without a thinner film portion attributable to the recess. As a result, the breakdown voltage of the gate oxide film and the characteristics of the semiconductor device can be improved.

The bird's beak preferably has a thickness which is substantially equal to the thickness of the gate oxide film at its proximal end.

The oxidation resistant mask film forming step preferably comprises the step of forming the oxidation resistant mask film into a pattern which uncovers a pair of regions on opposite sides of the channel region, and the selective thermal oxidation step preferably comprises the step of growing LOCOS oxide films in the pair of regions.

According to this method, the bird's beak can be grown by utilizing the step of selectively growing the LOCOS oxide films in the pair of regions on the opposite sides of the channel region. That is, there is no need to perform a special process for preventing the gate oxide film from having the thin film portion attributable to the recess.

The trench forming step may comprise the step of forming trenches in the pair of regions on the opposite sides of the channel region. In this method, the oxidation resistant mask film is formed as protruding by the predetermined distance into the pair of regions and uncovering portions of oxide films in the trenches in the pair of regions adjacent to boundaries between the channel region and the trenches, whereby recesses which may otherwise be formed in the oxide films in the trenches in the pair of regions can be eliminated by bird's beaks.

The method may further comprise the step of implanting impurity ions into the pair of regions before the selective thermal oxidation step. In this case, the method preferably further comprises the step of forming a pair of drift layers on the opposite sides of the channel region by thermally diffusing the impurity ions in the pair of regions in the semiconductor substrate by heat applied to the semiconductor substrate in the selective thermal oxidation step.

According to this method, the process can be simplified, because it is possible to diffuse the impurity ions in the pair of regions on the opposite sides of the channel region and grow the bird's beaks in the selective thermal oxidation step.

The inventive method preferably further comprises the step of forming a gate electrode which covers the channel region and has an edge located on the LOCOS oxide films or the oxide films in the trenches. Thus, a higher breakdown voltage transistor having a so-called drift drain structure can be provided. In addition, the gate oxide film can be formed as having a uniform thickness without a thinner film portion, so that a sufficient breakdown voltage can be ensured.

A semiconductor device production method according to a fifth aspect of the present invention is a production method for producing a semiconductor device including a transistor of a drift drain structure in which an oxide film thicker than a gate oxide film thereof is provided at an edge of a gate electrode thereof. As shown in FIGS. 9(a) to 9(h) by way of example, the method comprises the steps of: forming an oxidation resistant mask film 43 (e.g., a silicon nitride film) which covers a semiconductor substrate 40 (FIG. 9(a)); forming a resist film 44 on the oxidation resistant mask film 43, the resist film having resist openings 44a in a pair of regions on opposite sides of a channel region 77 (FIG. 9(b)); implanting ions into the semiconductor substrate 40 for formation of a pair of drift layers of the transistor by using the resist film 44 having the resist openings 44a as a mask (FIG. 9(c)); selectively etching the oxidation resistant mask film 43 by using the resist film 44 as a mask to form a pair of mask openings 43a in association with the pair of resist openings 44a of the resist film 44 in the oxidation resistant mask film 43 (FIG. 9(d)); thermally oxidizing a surface of the semiconductor substrate 40 by using the oxidation resistant mask film 43 as a mask after the ion implanting step and the oxidation resistant mask selective etching step, whereby LOCOS oxide films 84, 85 are formed in association with the respective mask openings 43a formed in the oxidation resistant mask film 43 and the implanted ions are thermally diffused in the semiconductor substrate 40 to form the pair of drift layers 78, 79 on the opposite sides of the channel region 77 (FIG. 9(e)); removing the oxidation resistant mask film 43 (FIG. 9(f)); forming a gate oxide film 80 thinner than the LOCOS oxide films 84, 85 on the surface of the semiconductor substrate 40 between the pair of drift layers 78, 79; and forming a gate electrode 81 which extends from an upper side of the gate oxide film 80 to upper sides of the LOCOS oxide films 84, 85 (FIG. 9(h)).

According to this method, the ion implantation for the formation of the drift layers and the formation of the mask openings in the oxidation resistant mask film on the opposite sides of the channel region are achieved by using the single resist film as the mask. That is, the same resist film is used for the ion implantation for the formation of the drift layers and for the patterning of the oxidation resistant mask film. Thus, the drift layers and the LOCOS oxide films are formed in a self-aligning manner, making it possible to accurately control an intrusion distance by which the drift layers intrude into the channel region from edges of the LOCOS oxide films adjacent to the channel region. Thus, variations in the breakdown voltage of the transistor of the drift drain structure can be suppressed.

The resist openings of the resist film or the mask openings of the oxidation resistant mask film are not necessarily required to be closed openings. For example, the pair of resist openings or the pair of mask openings disposed on the opposite sides of the channel region may be connected to each other in a region other than the channel region thereby to be defined as a single opening.

The foregoing and other objects, features and effects of the present invention will become more apparent from the following description of the embodiments with reference to the attached drawings.

EMBODIMENTS OF THE INVENTION

Figure 1:
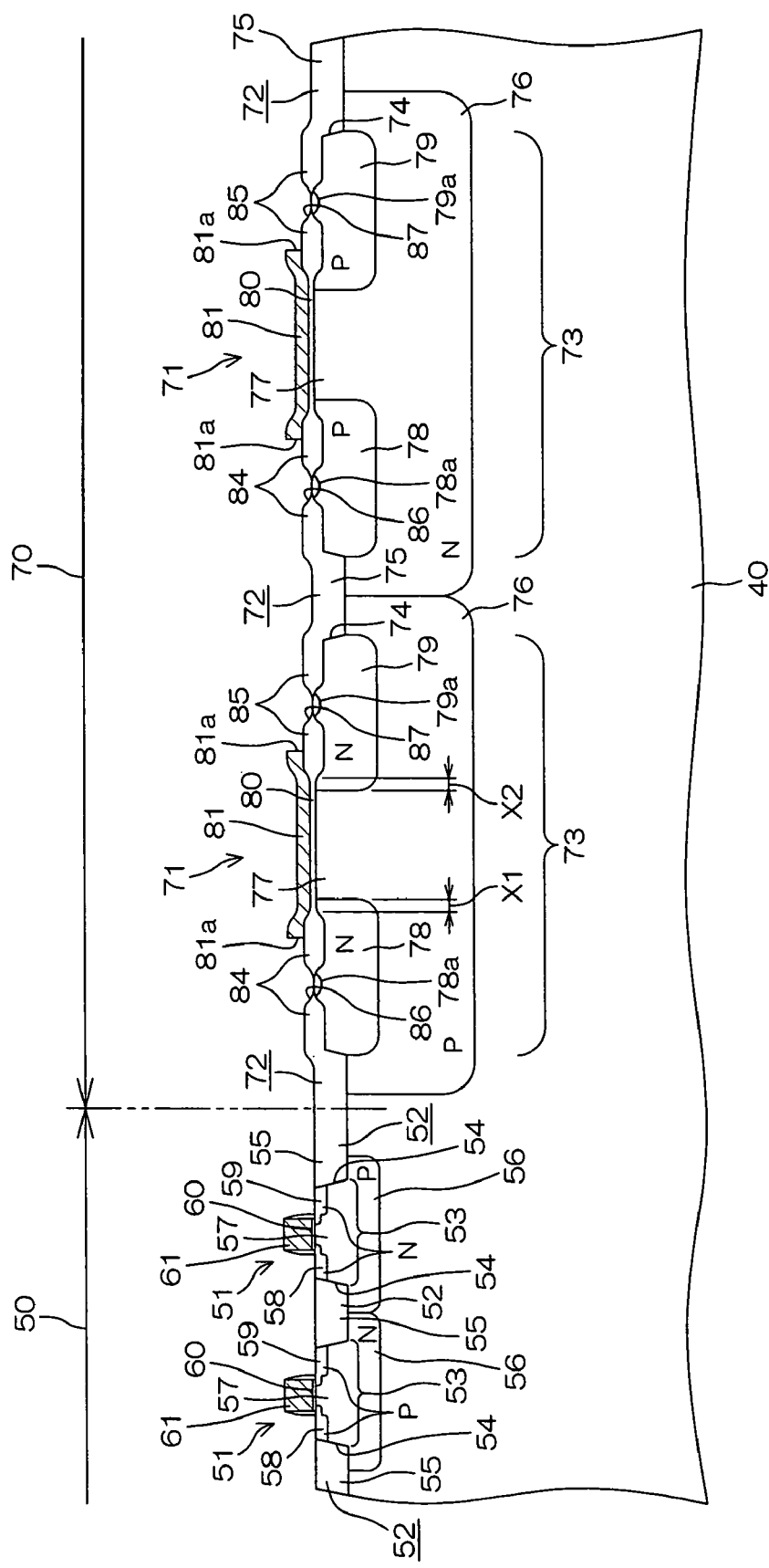
FIG. 1 is a schematic sectional view for explaining the construction of a semiconductor device according to one embodiment of the present invention.

FIG. 1 is a schematic sectional view for explaining the construction of a semiconductor device according to one embodiment of the present invention. The semiconductor device includes a silicon substrate (an example of a semiconductor substrate) 40 having a first region 50 formed with a plurality of lower breakdown voltage transistors 51 and a second region 70 formed with a plurality of higher breakdown voltage transistors 71.

The lower breakdown voltage transistors 51 formed in the first region 50 are respectively disposed in device formation regions 53 isolated by a shallow trench isolation (STI) portion 52 formed in a surface of the silicon substrate 40. The STI portion 52 is formed by filling silicon oxide 55 in a shallow trench 54 (e.g., having a depth of about 4000 Å) formed in the surface of the semiconductor substrate 40.

Wells (P-type wells or N-type wells) 56 are respectively provided in regions including the device formation regions 53 in the surface of the silicon substrate 40. In each of the wells 56, a source diffusion layer 58 and a drain diffusion layer 59 (N-type diffusion layers in the P-type well or P-type diffusion layers in the N-type well) are provided on opposite sides of a channel region 57. A gate oxide film 60 (third oxide film) having a thickness of 32 Å, for example, is provided on the surface of the channel region 57, and a gate electrode 61 is provided on the gate oxide film 60.

Though not shown, an interlevel insulation film is provided as covering the gate electrode 61 and the source/drain diffusion layers 58, 59. A source electrode and a drain electrode are respectively connected to the source diffusion layer 58 and the drain diffusion layer 59 through contact holes formed in the interlevel insulation film.

The lower breakdown voltage transistors 51 provided in the first region 50 may each be an N-channel transistor (including N-type source/drain diffusion layers provided in the P-type well) or a P-channel transistor (including P-type source/drain diffusion layers provided in the N-type well). Alternatively, an N-channel transistor and a P-channel transistor may be included in combination.

The higher breakdown voltage transistors 71 provided in the second region 70 are respectively disposed in device formation regions 73 isolated by an STI portion 72 formed in the surface of the silicon substrate 40. The STI portion 72 is formed by filling silicon oxide 75 in a shallow trench 74 (e.g., having a depth of about 4000 Å) formed in the surface of the semiconductor substrate 40.

Wells (P-type wells or N-type wells) 76 are respectively provided in regions including the device formation regions 73 in the surface of the silicon substrate 40. In each of the wells 76, a source drift layer 78 and a drain drift layer 79 (N-type drift layers in the P-type well or P-type drift layers in the N-type well) are provided on opposite sides of a channel region 77 (active region). A gate oxide film 80 (second oxide film) having a thickness of 1000 Å, for example, is provided on the surface of the channel region 77, and a gate electrode 81 is provided on the gate oxide film 80.

Thick LOCOS oxide films 84, 85 (first oxide film, e.g., having a thickness of about 2800 Å) are respectively provided on surfaces of the drift layers 78, 79. The gate electrode 81 extends from an upper side of the channel region 77 to edge portions of the LOCOS oxide films 84, 85 adjacent to the channel region 77. Therefore, an edge 81a of the gate electrode 81 is located on the LOCOS oxide films 84, 85 which are thicker than the gate oxide film 80, so that concentration of an electric field can be prevented. Thus, the drift drain structure is provided which realizes a higher breakdown voltage.

The LOCOS oxide films 84, 85 respectively have contact holes 86, 87 for connecting the drift layers 78, 79 to a source electrode and a drain electrode. A source contact layer 78a and a drain contact layer 79a each containing an impurity of the same conductivity as the drift layers 78, 79 at a higher concentration are respectively provided immediately below the contact holes 86, 87. Though not shown, the aforementioned interlevel insulation film also covers the gate electrode 81 and the LOCOS oxide films 84, 85. The interlevel insulation film has contact holes for the source and drain electrodes. These contact holes communicate with the corresponding contact holes 86, 87 formed in the LOCOS oxide films 84, 85.

The drift layers 78, 79 intrude into the channel region 77 below the LOCOS oxide films 84, 85. Intrusion distances X1, X2 by which the drift layers 78, 79 intrude into the channel region 77 from the edges of the LOCOS oxide films 84, 85 adjacent to the channel region 77 are accurately controlled and their variations are suppressed by a production method to be described later.

The higher breakdown voltage transistors 71 provided in the second region 70 may each be an N-channel transistor (including N-type drift layers provided in the P-type well) or a P-channel transistor (including P-type drift layers provided in the N-type well). Alternatively, an N-channel transistor and a P-channel transistor may be included in combination.

The higher breakdown voltage transistors 71 each have a higher breakdown voltage than the lower breakdown voltage transistors 51. For example, the operation voltage of the higher breakdown voltage transistors 71 is about 40V, while the operation voltage of the lower breakdown voltage transistors 51 is about 1.8V. The lower breakdown voltage transistors 51 each have a more minute structure than the higher breakdown voltage transistors 71. The device size of the higher breakdown voltage transistors 71 (the size of the device formation regions 73) is on the order of 20 μm, while the device size of the lower breakdown voltage transistors 51 (the size of the device formation regions 53) is on the order of 1 μm.

In the semiconductor device according to this embodiment, the device formation regions 53, 73 are isolated by the STI portions 52, 72, so that an area required for the device isolation can be reduced as compared with a case in which the device isolation is achieved by the LOCOS method. Thus, the lower breakdown voltage transistors 51 each having a minute structure can be arranged at a higher density particularly in the first region 50 defined as the lower breakdown voltage region. In the second region 70 defined as the higher breakdown voltage region, on the other hand, the thick oxide films for the drift drain structure are defined by the LOCOS oxide films 84, 85. Thus, the problem of the concentration of the electric field can be solved which may otherwise occur when the thick oxide films are provided by the STI structure, thereby improving the breakdown voltage of the higher breakdown voltage transistors 71.

Figure 2A:
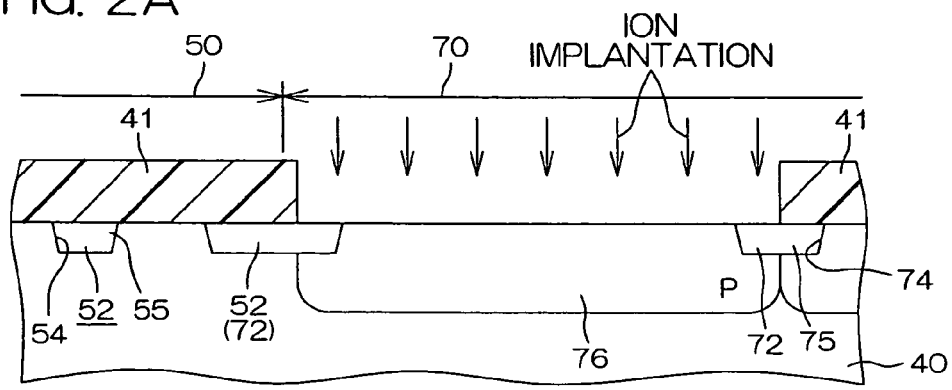
FIGS. 2A to 2N are sectional views illustrating the steps of a production process for the semiconductor device.

FIGS. 2A to 2L are sectional views illustrating the steps of the production process for the semiconductor device. As shown in FIG. 2A, a silicon substrate 40 formed with STI portions 52, 72 is prepared. More specifically, trenches 54, 74 (having a depth of about 4000 Å) are respectively formed in first and second regions 50, 70 in a surface of the silicon substrate 40, for example, by reactive ion etching, and a silicon oxide film (HDP: high density plasma CVD oxide film) is formed on the entire surface of the resulting substrate. Thereafter, the surface of the resulting substrate is planarized by a CMP (chemical mechanical polishing) method to remove a portion of the silicon oxide film outside the trenches 54, 74. Thus, the STI portions 52, 72 are provided as having a structure such that the silicon oxide 55, 75 is filled in the trenches 54, 74.

In this state, a resist film 41 having an opening in association with a region to be formed with a well 76 in the second region 70 is formed on the surface of the silicon substrate 40, and impurity ions for the formation of the well 76 are implanted into the silicon substrate by using the resist film 41 as a mask. Where the well 76 is of a P-type, the impurity ions are, for example, boron ions. Where the well 76 is of an N-type, the impurity ions are, for example, phosphorus ions. Since the first region 50 is covered with the resist film 41 during the ion implantation, the impurity ions are not introduced into the first region 50.

Figure 2B:
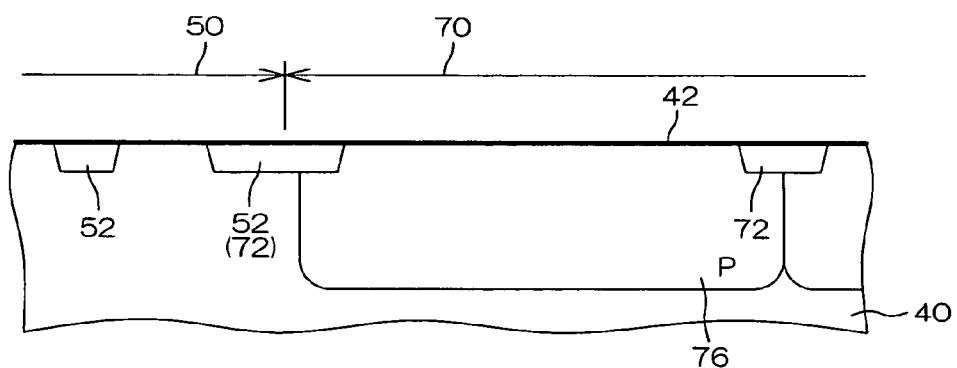

In turn, as shown in FIG. 2B, the resist film 41 is peeled off, and a pad oxide film 42 is formed on the entire surface of the resulting silicon substrate 40 by a thermal oxidation method. At this time, the impurity ions implanted into the silicon substrate 40 are thermally diffused (driven) in the silicon substrate by utilizing heat applied to the silicon substrate 40. Thus, the well 76 is formed in the silicon substrate 40.

Figure 2C:
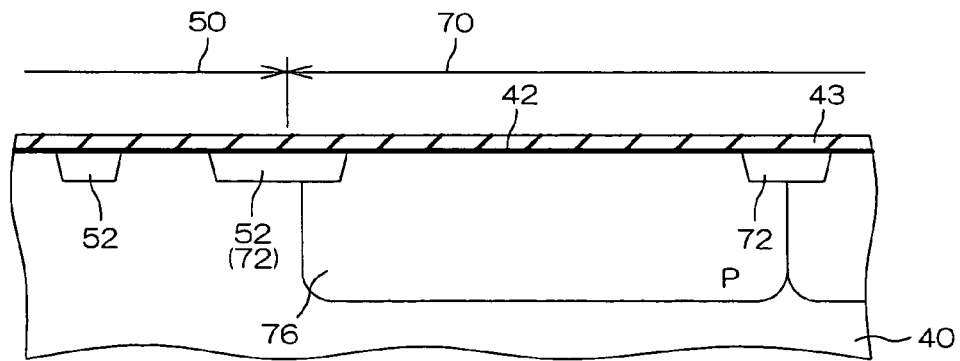
Figure 2D:
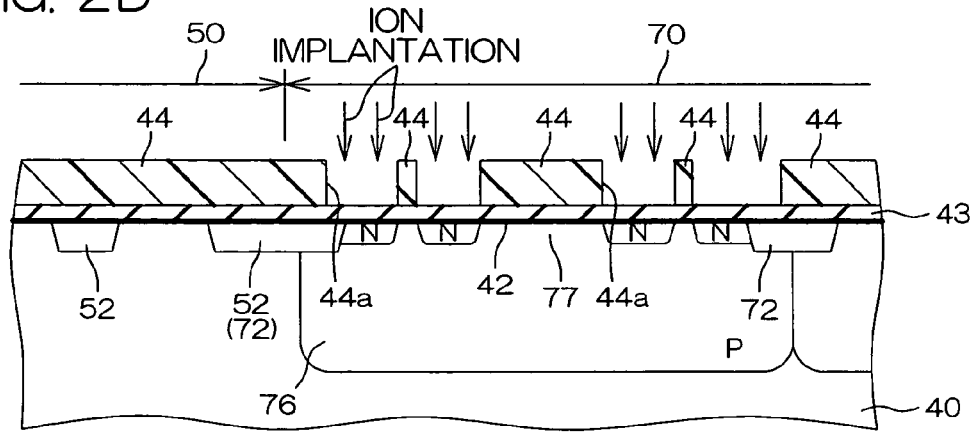

Subsequently, as shown in FIG. 2C, a silicon nitride film 43 (e.g., having a thickness of about 300 Å) is formed as covering the entire surface of the pad oxide film 42 by a CVD (chemical vapor deposition) method. Then, as shown in FIG. 2D, a pattern of a resist film 44 is formed on a surface of the silicon nitride film 43. The resist film 44 has resist openings 44a for the LOCOS oxide films 84, 85 in the structure shown in FIG. 1 (resist openings formed in a pair of regions on opposite sides of a channel region 77) and covers the other region. That is, the resist film 44 entirely covers the first region 50, and covers a channel formation region in which the channel region 77 is to be formed and contact hole formation regions in which contact holes 86, 87 are to be formed in the second region 70. A region of the substrate uncovered with the resist film 44 is a first oxide film formation region.

By using the resist film 44 as a mask, impurity ions for formation of drift layers 78, 79 are implanted into the substrate. The conductivity of the impurity ions is opposite to the conductivity of the well 76. Where the drift layers 78, 79 are of an N-type, the impurity ions are, for example, phosphorus ions. Where the drift layers 78, 79 are of a P-type, the impurity ions are, for example, boron ions. Energy for the implantation of the impurity ions is determined so that an ion projection distance is smaller than the thickness of the STI portion 72.

Figure 2E:
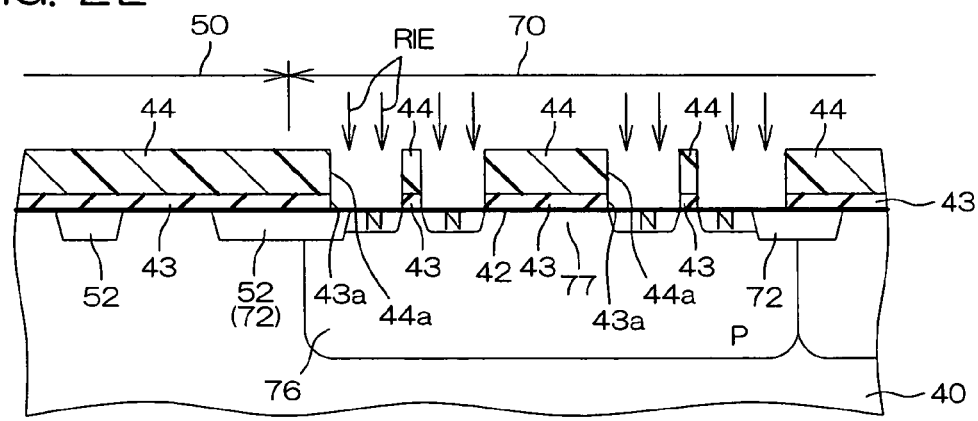

Thereafter, as shown in FIG. 2E, reactive ion etching (RIE) which is a type of dry etching is performed by using the resist film 44 as a mask to pattern the silicon nitride film 43 which thereafter serves as an oxidation resistant mask film. Like the resist film 44, the nitride film 43 entirely covers the first region 50 and covers the channel formation region and the contact hole formation regions in the second region 70. Since the silicon nitride film 43 is patterned by using the resist film 44, the silicon nitride film 43 has mask openings 43a in alignment with the resist openings 44a of the resist film 44. Therefore, the mask openings 43a are formed in the pair of regions on the opposite sides of the channel region 77.

Figure 2F:
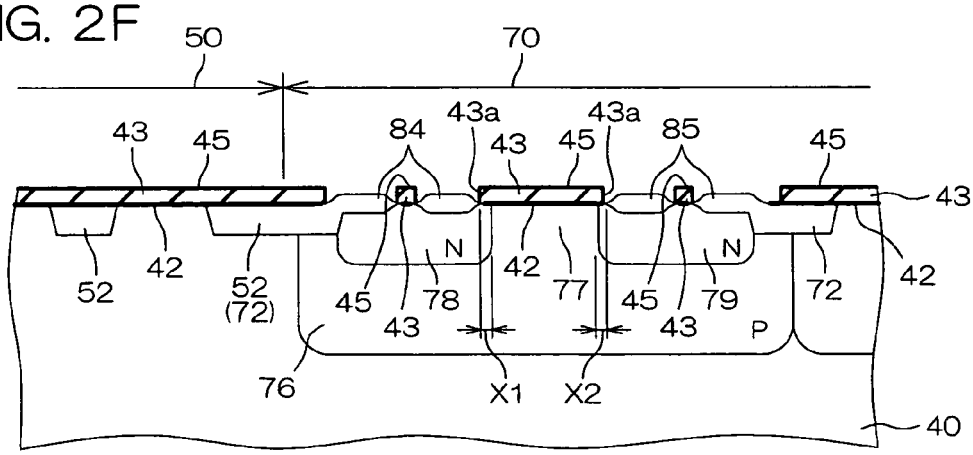

In turn, as shown in FIG. 2F, thermal oxidation (LOCOS method) is performed by using the silicon nitride film 43 as the oxidation resistant mask. Thus, the LOCOS oxide films 84, 85 are formed in the regions on the opposite sides of the channel region 77 (on drift layer formation regions in which the drift layers 78, 79 are to be formed). Further, the implanted ions are diffused (driven) in the substrate, whereby the drift layers 78, 79 are formed on the opposite sides of the channel region 77.

The LOCOS oxide films 84, 85 each have a thickness of about 2800 Å. The drift layers 78, 79 respectively intrude into the channel region 77 by intrusion distances X1, X2 from edges of the LOCOS oxide films 84, 85 adjacent to the channel region 77. As described with reference to FIGS. 2D and 2E, the resist film 44 employed as the mask for the ion implantation for the formation of the drift layers 78, 79 is used for the patterning of the silicon nitride film 43 to be used as the oxidation resistant mask for the formation of the LOCOS oxide films 84, 85. Therefore, the drift layers 78, 79 and the LOCOS oxide films 84, 85 are formed in a self-aligning manner. As a result, the aforesaid intrusion distances X1, X2 are determined by a distance of the diffusion caused by the heat and, therefore, accurately controllable. Hence, variations in the intrusion distances between the higher breakdown voltage transistors 71 and between plural semiconductor devices can be suppressed. Thus, the variations in the intrusion distances are drastically reduced.

As shown in FIG. 2F, an oxide layer (thin oxide film) 45 (e.g., having a thickness of about 150 Å) is formed in the surface of the silicon nitride film 43 by the thermal oxidation for the formation of the LOCOS oxide films 84, 85. Thus, the thickness of the silicon nitride film 43 is reduced by the thickness of the oxide layer 45 (e.g. to about 150 Å). Where the oxide layer 45 is not grown to have a sufficient thickness on the silicon nitride film 43 in the formation of the LOCOS oxide films 84, 85, the oxide layer 45 may be grown to cover the silicon nitride film 43, for example, by a CVD method.

Figure 2G:
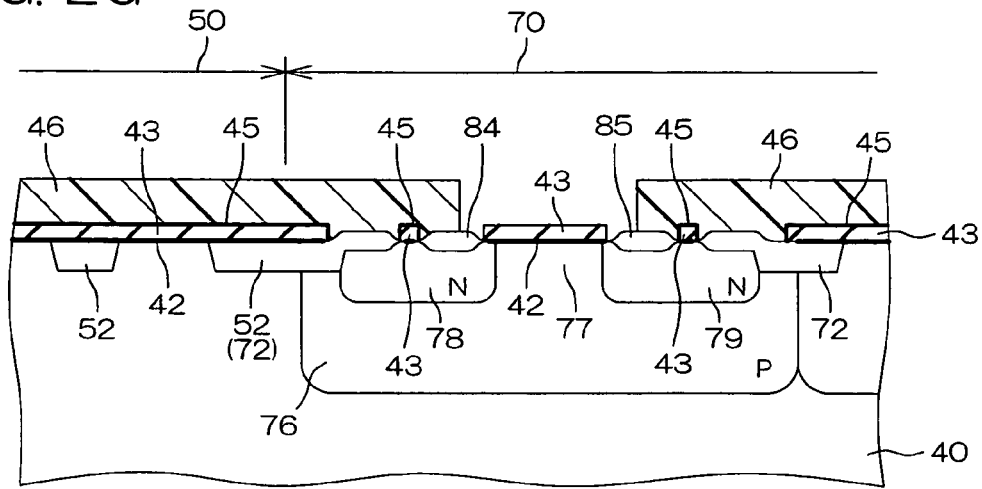

In turn, as shown in FIG. 2G, a resist film 46 is formed as having a pattern which uncovers the channel region 77 (a region (second oxide film formation region) between the LOCOS oxide films 84 and 85) and covers the other portion of the silicon substrate 40. Then, wet etching with a fluoric acid solution is performed by using the resist film 46 as a mask. Thus, a portion of the oxide layer 45 on the surface of the silicon nitride film 43 uncovered with the resist film 46 is etched away. The rate of the etching with the fluoric acid solution is sufficiently lower for the silicon nitride film 43 than for silicon oxide. Accordingly, the silicon nitride film 43 remains on the silicon substrate 40.

Figure 2H:
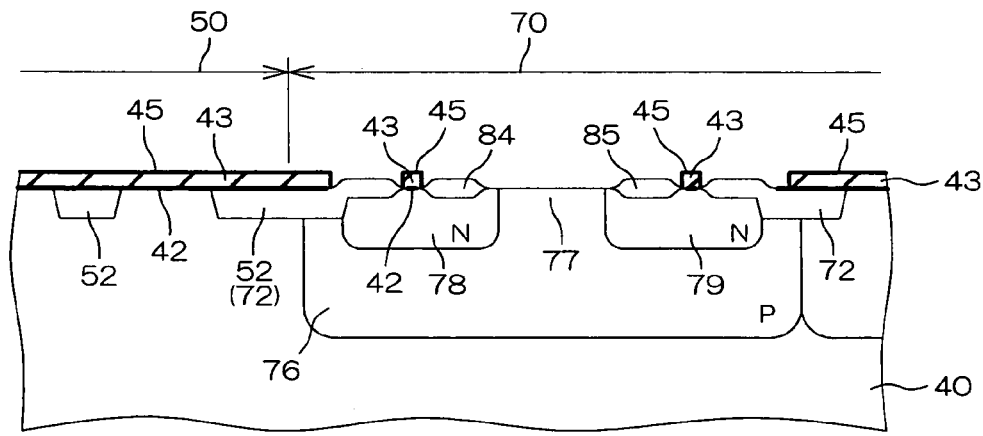

Subsequently, as shown in FIG. 2H, etching with a hot phosphoric acid solution (a phosphoric acid solution at a temperature higher than the room temperature) is performed after the resist film 46 is peeled off. More specifically, the silicon substrate 40 is immersed in a phosphoric acid solution at 150° C. for about 60 minutes, for example. Thus, a portion of the silicon nitride film 43 not formed with the oxide layer 45 is peeled off. That is, the portion of the silicon nitride film 43 between the LOCOS oxide films 84 and 85 is selectively removed. At this time, silicon oxide remains on the silicon substrate 40 substantially as it is because the rate of the etching with the hot phosphoric acid solution for silicon oxide is low. Thus, only the portion of the silicon nitride film 43 on the channel region 77 can be selectively removed with the first region 50 covered with the silicon nitride film 43 (and with the region other than the channel region 77 in the second region 70 covered with the silicon nitride film 43). The selectivity of the silicon nitride film 43 to the pad oxide film 42 (underlying film) in the etching with the hot phosphoric acid solution is not lower than 100, so that a margin for etching time is increased.

Thereafter, a portion of the pad oxide film 42 on the channel region 77 is removed by the etching with a fluoric acid solution to uncover a surface portion of the silicon substrate 40.

Figure 2I:
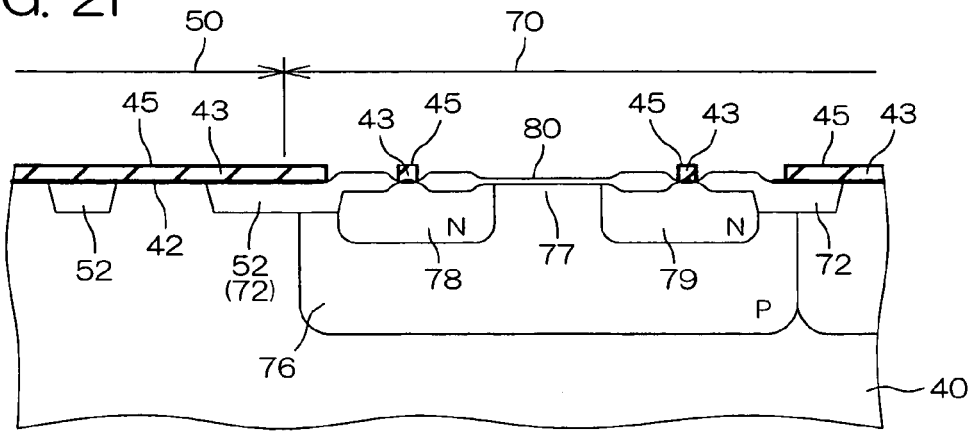

In this state, a thermal oxidation process is performed to grow a gate oxide film 80 (e.g., having a thickness of 1000 Å) on the channel region 77 as shown in FIG. 2I. At this time, the region other than the channel region 77 is covered with the silicon nitride film 43. Therefore, the oxide film slightly grows on the silicon nitride film 43, but does not grow on a surface of the silicon substrate 40 outside the channel region 77.

Thus, the selective removal of the portion of the silicon nitride film 43 on the channel region 77 in the second region 70 is achieved by the wet etching process using the fluoric acid solution and the phosphoric acid solution, and does not require a dry etching process such as reactive ion etching. Hence, there is no possibility that the surface of the silicon substrate 40 in the channel region 77 is damaged by plasma. Therefore, the gate oxide film 80 can be formed as having an excellent film quality, and the crystalline structure of the surface of the silicon substrate 40 in the channel region 77 in which a carrier is movable can be kept at a proper state. In the step of forming the mask openings 43a in the silicon nitride film 43 by the reactive ion etching process as shown in FIG. 2E, the openings are formed in the LOCOS oxide film formation regions. Therefore, the surface portions of the silicon substrate 40 damaged at this time do not influence the device characteristics.

Further, this method is advantageous in that formation of a significant step between the first and second regions 50, 70 can be prevented, as compared with a case in which a thin gate oxide film is selectively formed in the first region 50 after a thick gate oxide film for the second region 70 is formed in both of the first and second regions 50, 70 and a portion of the thick gate oxide film in the first region 50 is selectively removed. That is, the three types of silicon oxide films, i.e., the gate oxide film 60 for the first region 50, the gate oxide film 80 for the second region 70, and the LOCOS oxide films 84, 85, having different thicknesses, can be formed without formation of a significant step. Thus, the reduction of the focus margin in the lithography process to be performed later can be suppressed.

After the step shown in FIG. 2I, the silicon nitride film 43 on the silicon substrate 40 is entirely peeled off as shown in FIG. 2J. More specifically, the oxide layer 45 on the silicon nitride film 43 is etched by a fluoric acid solution, and then the silicon nitride film 43 is removed by a hot phosphoric acid solution. The thickness of the gate oxide film 80 is slightly reduced by the etching of the thin oxide film on the surface of the silicon nitride film 43. However, the etching performed at this time is merely intended to remove the thin oxide film on the silicon nitride film 43, and the etching of only a surface of the gate oxide film 80 is not anything problematic.

In turn, as shown in FIG. 2K, a resist film 47 is formed so as to entirely cover the second region 70 and uncover a surface of the silicon substrate 40 in a well formation region in which the well 56 is to be formed in the first region 50. Impurity ions for the formation of the well 56 are implanted into the substrate by using the resist film 47 as a mask. Where the well 56 is of a P-type, the impurity ions are, for example, boron ions. Where the well 56 is of an N-type, the impurity ions are, for example, phosphorus ions. Since the second region 70 is covered with the resist film 47 during the ion implantation, the impurity ions are not introduced into the second region 70.

Subsequently, as shown in FIG. 2L, wet etching is performed with a fluoric acid solution by using the resist film 47 as a mask, whereby a portion of the pad oxide film 42 in the first region 50 (particularly, in the well formation region) is removed from the surface of the silicon substrate 40.

Figure 2M:
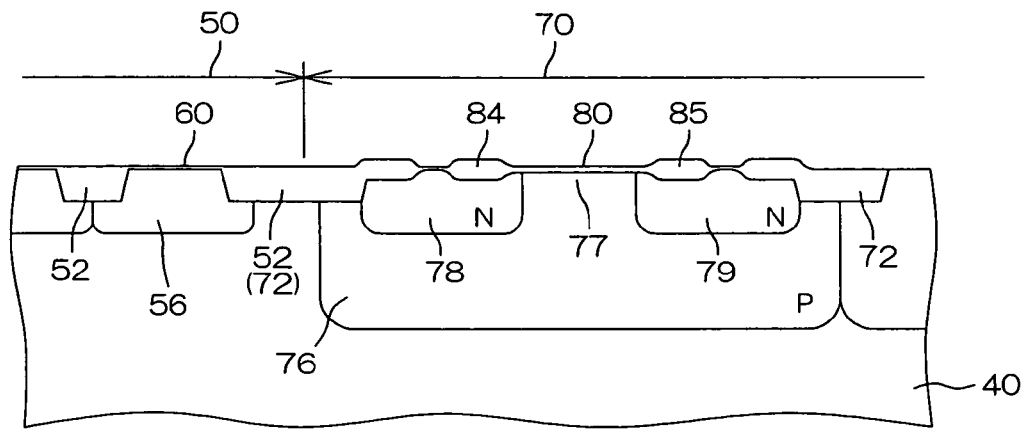

Then, as shown in FIG. 2M, a gate oxide film 60 is formed on the well formation region (third oxide film formation region) by a thermal oxidation method. The gate oxide film 60 has a thickness of, for example, 32 Å. In the step of forming the LOCOS oxide films 84, 85 in the second region 70 and in the step of forming the gate oxide film 80 in the second region 70, a surface portion of the silicon substrate 40 to be formed with the gate oxide film 60 is constantly protected by the silicon nitride film 43. Therefore, the gate oxide film 60 formed in the first region 50 is not influenced by the formation of the LOCOS oxide films 84, 85 and the gate oxide film 80 in the second region 70. Further, introduction of crystalline defects in the silicon substrate 40 is prevented which may otherwise be caused by a stress occurring when a thick oxide film is formed on a minute pattern as in the first region 50, thereby preventing increase in leak current.

Figure 2N:
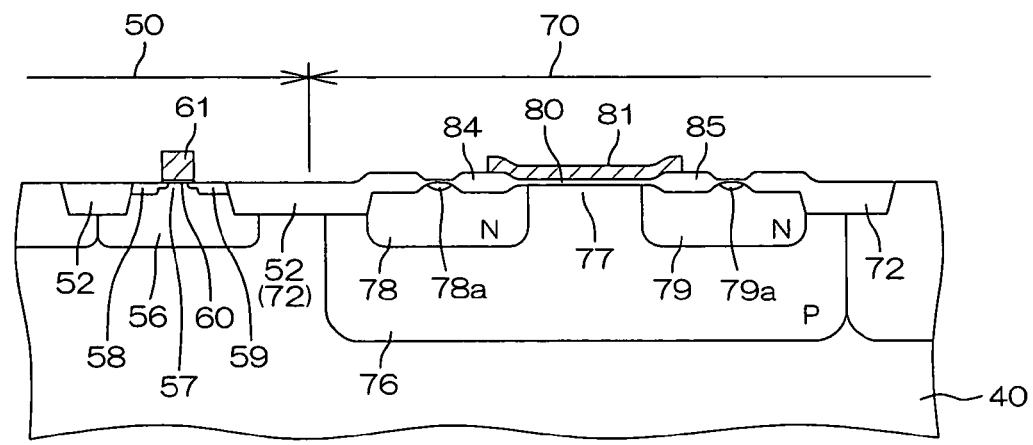

In turn, as shown in FIG. 2N, a gate electrode 61 of the lower breakdown voltage transistor 51 and a gate electrode 81 of the higher breakdown voltage transistor 71 are formed. These gate electrodes may each be composed of, for example, a polysilicon film. More specifically, a polysilicon film is formed on the entire surface of the silicon substrate 40, and then etched to form the gate electrodes 61, 81. The gate electrode 81 has a pattern such that edge portions thereof are present on the LOCOS oxide films 84, 85.

Thereafter, ion implantation is performed for formation of a source and a drain, whereby a source diffusion layer 58 and a drain diffusion layer 59 of the lower breakdown voltage transistor 51 are formed on opposite sides of the gate electrode 61, and the source contact layer 78*a* and the drain contact layer 79*a* are formed immediately below the openings formed in center portions of the LOCOS oxide films 84, 85 on the drift layers 78, 79. Thus, the semiconductor device having a construction shown in FIG. 1 is provided.

Figure 3:
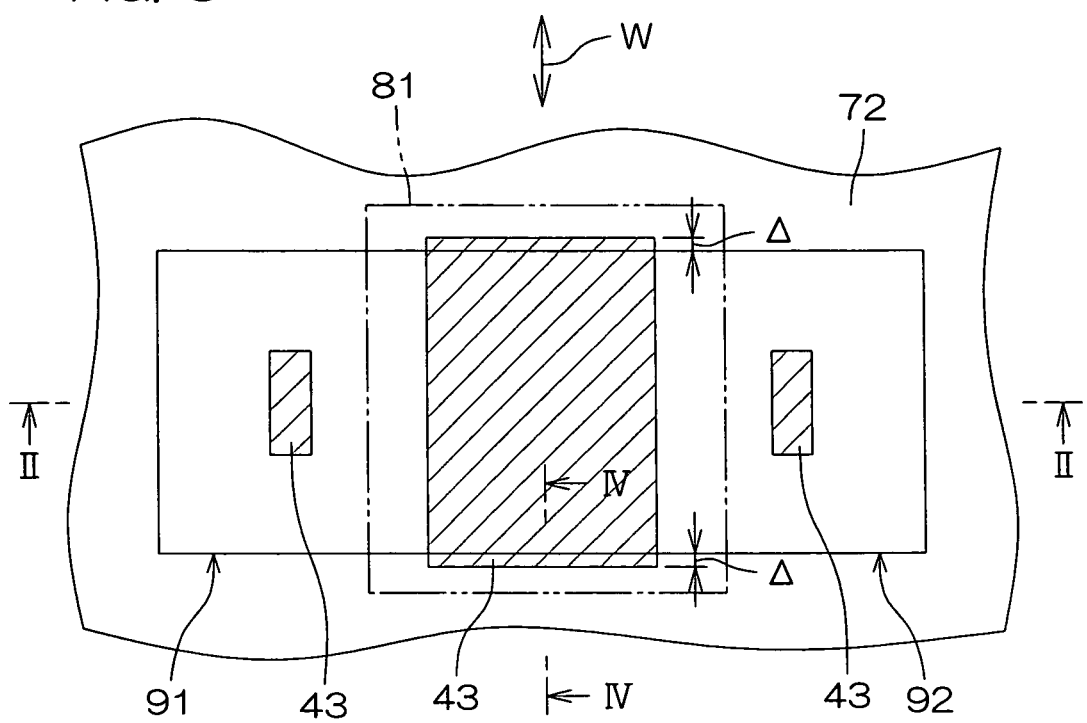
FIG. 3 is a plan view illustrating the construction of a higher breakdown voltage transistor in the step of FIG. 2E.

FIG. 3 is a plan view illustrating the construction of the higher breakdown voltage transistor 71 in the step of FIG. 2E. FIG. 2E illustrates a sectional construction taken along a sectional line II-II in FIG. 3. Further, FIG. 4A is a sectional view taken along a sectional line IV-IV in FIG. 3, and FIGS. 4B and 4C are similar sectional views respectively corresponding to the step of FIG. 2F and the step of FIG. 2I.

The silicon nitride film 43 patterned by the reactive ion etching (hatched in FIG. 3) has a pattern which extends from the channel region 77 to the STI portion 72 by a very small distance Δ (e.g., 0.1 μm to 0.2 μm) in a direction W widthwise of the channel region 77 defined by the STI portion 72. The portion of the silicon nitride film 43 present on the channel region 77 has a length corresponding to a desired channel length of the channel region 77 (in a direction along which the pair of drift layers 78, 79 are opposed to each other). On the opposite sides of the channel region 77, surface portions of the silicon substrate 40 are exposed in a pair of rectangular regions 91, 92 surrounded by the STI portion 72 and the silicon nitride film 43. Portions of the silicon nitride film 43 for the contact holes 86, 87 are present in center portions of the respective rectangular regions 91, 92.

Figure 4A:
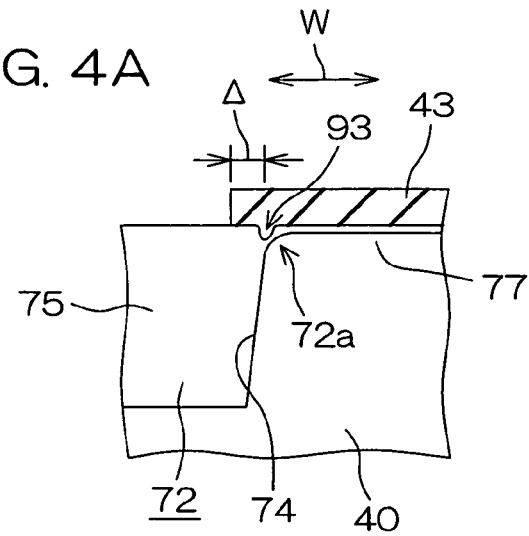
FIG. 4A is a sectional view taken along a sectional line IV-IV in FIG. 3, and FIGS. 4B and 4C are similar sectional views respectively corresponding to the step of FIG. 2F and the step of FIG. 2I.

As shown in FIG. 4A, a recess (divot) 93 is formed on an upper edge 72*a* of the STI portion 72 (an edge of the channel region 77) due to a cleaning process performed (by light etching with a fluoric acid solution) before each of the impurity diffusion processes (the step shown in FIG. 2B and the like). If the recess 93 remains when the gate oxide film 80 is formed, the gate oxide film 80 has a significantly thinner film portion in the vicinity of the recess 93. The thinner film portion is a cause of the leak, thereby reducing the breakdown voltage of the gate oxide film. Further, the thinner film portion partly defines a lower threshold region, thereby deteriorating the static characteristics of the higher breakdown voltage transistor 71 (for example, making the threshold unstable).

Figure 4B:
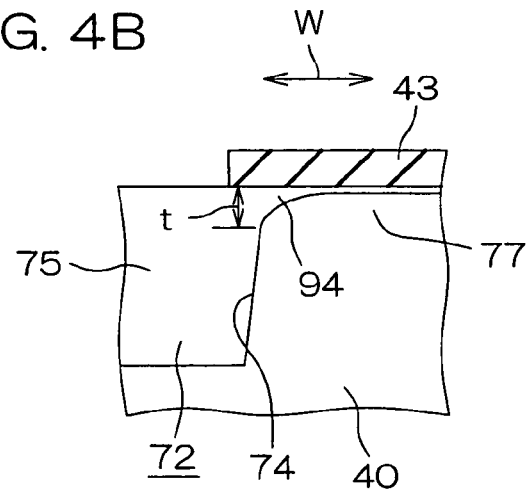
Figure 4C:
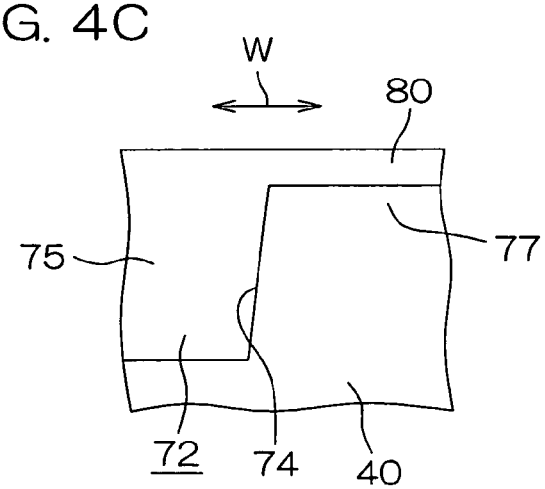

In this embodiment, as shown in FIG. 4B, a bird's beak 94 is grown as extending from the STI portion 72 to the channel region 77 for removing the recess 93 in the thermal oxidation process for the formation of the LOCOS oxide films 84, 85 (the thermal diffusion process for the formation of the drift layers 78, 79) before the formation of the gate oxide film 80. That is, as previously described, the silicon nitride film 43 has a pattern which extends to the STI portion 72 by the very small distance Δ widthwise of the channel region 77 and uncovers a portion of the STI portion 72 adjacent to a boundary between the STI portion 72 and the channel region 77. Therefore, the oxide film grows in the uncovered portion of the STI portion 72 by heating in an oxygen atmosphere. The bird's beak 94 intrudes into the channel region 77 below the silicon nitride film 43. Thus, the recess 93 is eliminated.

The very small distance Δ is determined so that the thickness t of a proximal portion of the bird's beak 94 grown in the thermal oxidation process is substantially equal to the desired thickness (e.g., 1000 Å) of the gate oxide film 80. More preferably, the thickness t is determined so as to be substantially equal to the sum of the desired thickness of the gate oxide film 80 and the thickness of the pad oxide film 42 (which is later etched away with the fluoric acid solution).

In the thermal oxidation process for the formation of the gate oxide film 80, as shown in FIG. 4C, the gate oxide film 80 grown in the surface of the silicon substrate 40 on the channel region 77 is connected to the bird's beak 94. Thus, the gate oxide film 80 has a uniform thickness from its center portion to its edge over the channel region 77.

Figure 5:
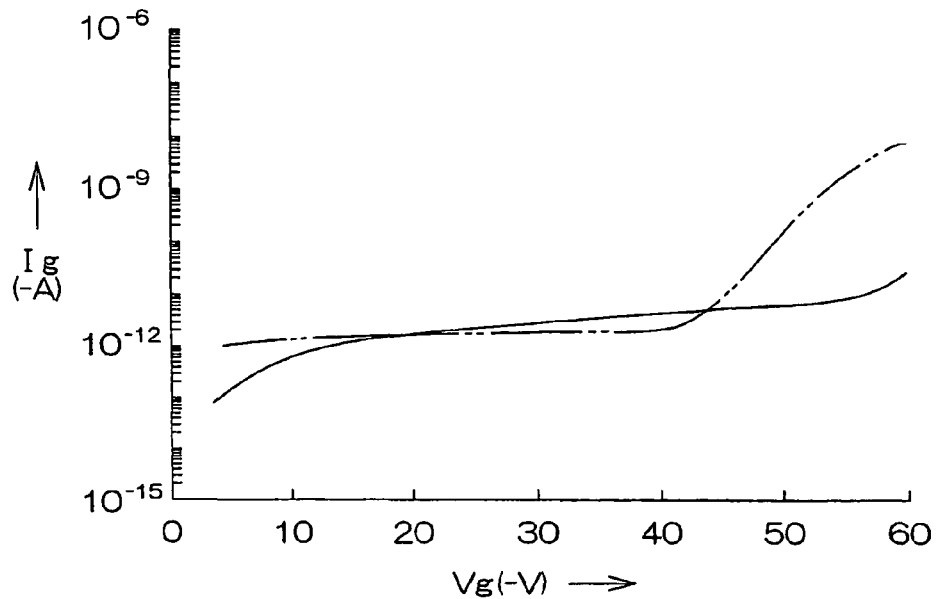
FIG. 5 is a diagram illustrating a relationship between the gate voltage Vg and the gate leak current Ig to show the breakdown voltage of a gate oxide film of the higher breakdown voltage transistor.

FIG. 5 is a diagram illustrating a relationship between the gate voltage Vg (a voltage applied to the gate electrode 81) and the gate leak current Ig to show the breakdown voltage of the gate oxide film of the higher breakdown voltage transistor 71, wherein a two-dot-and-dash line indicates a gate oxide film breakdown voltage characteristic observed when no measures are taken for the elimination of the recess 93, and a solid line indicates a gate oxide film breakdown voltage characteristic observed when measures are taken for the elimination of the recess 93. As can be understood from FIG. 5, the gate breakdown voltage is apparently improved by taking the measures for the elimination of the recess 93. This is because, where no measures are taken for the elimination of the recess 93, the gate oxide film has the thinner film portion on which the electric field is concentrated to deteriorate the breakdown voltage. On the other hand, where the recess 93 is eliminated to make the thickness of the gate oxide film 80 uniform, the concentration of the electric field can be suppressed.

Figure 6:
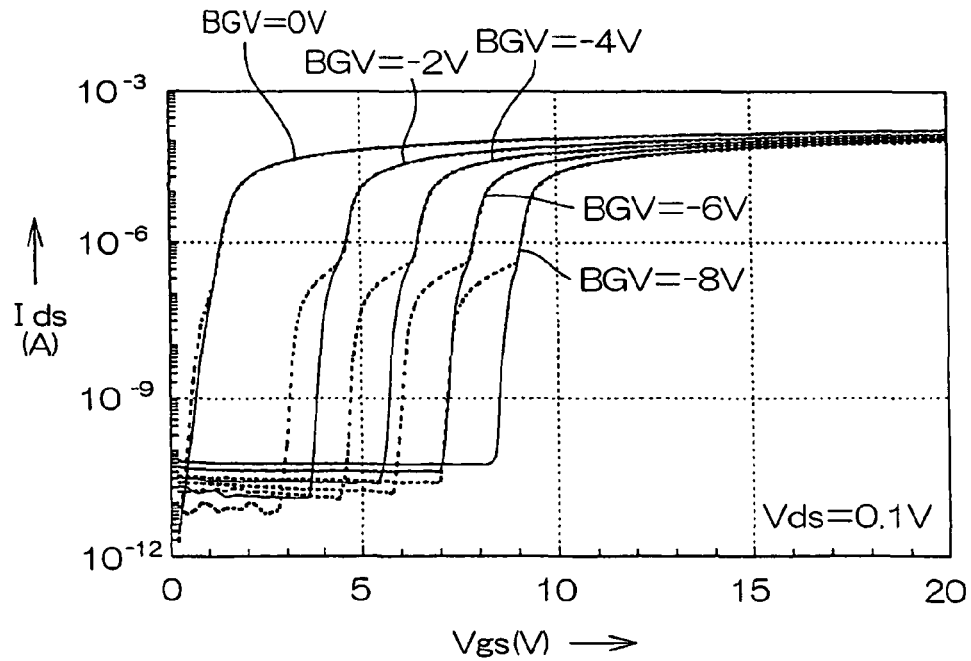
FIG. 6 is a diagram illustrating changes in drain current Ids relative to the gate voltage Vgs, wherein the source is grounded and the drain voltage Vds=0.1V, to show the static characteristics of the N-channel higher breakdown voltage transistor.

FIG. 6 is a diagram illustrating changes in drain current Ids relative to the gate voltage Vgs, wherein the source is grounded and the drain voltage Vds=0.1V, to show the static characteristics of the higher breakdown voltage transistor 71, wherein broken lines indicate characteristics observed when no measures are taken for the elimination of the recess 93, and solid lines indicate characteristics observed when the measures are taken for the elimination of the recess 93. The characteristic curves were obtained when a back gate voltage BGV (to be applied to the silicon substrate 40) was set at 0V, −2V, −4V, −6V and −8V.

As can be understood from FIG. 6, a hump phenomenon occurs in which a plurality of thresholds appear. This phenomenon becomes more remarkable as the back gate voltage BGV is increased. While FIG. 6 illustrates an exemplary characteristics of an N-channel high breakdown voltage transistor, a similar phenomenon is observed for a P-channel high breakdown voltage transistor. The hump phenomenon is caused by partial electrical conduction which occurs in the thinner film portion of the gate oxide film attributable to the recess 93. Where the thickness of the gate oxide film 80 is made uniform by eliminating the recess 93, the partial electrical conduction can be suppressed, thereby suppressing the hump phenomenon. Thus, excellent static characteristics can be realized even if the back gate voltage is increased.

Figure 7:
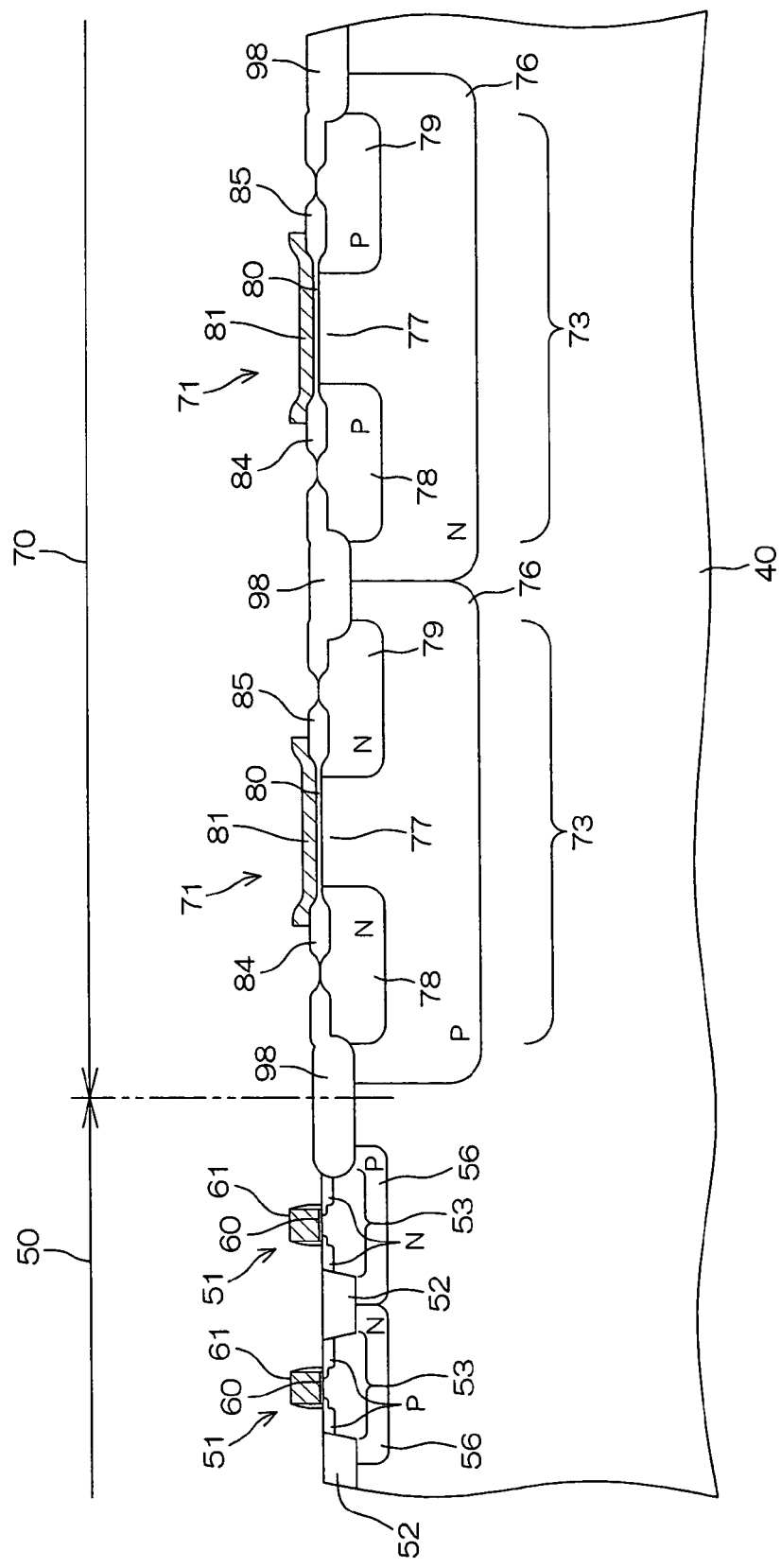
FIG. 7 is a schematic sectional view for explaining the construction of a semiconductor device according to another embodiment of the present invention.
Figure 8:
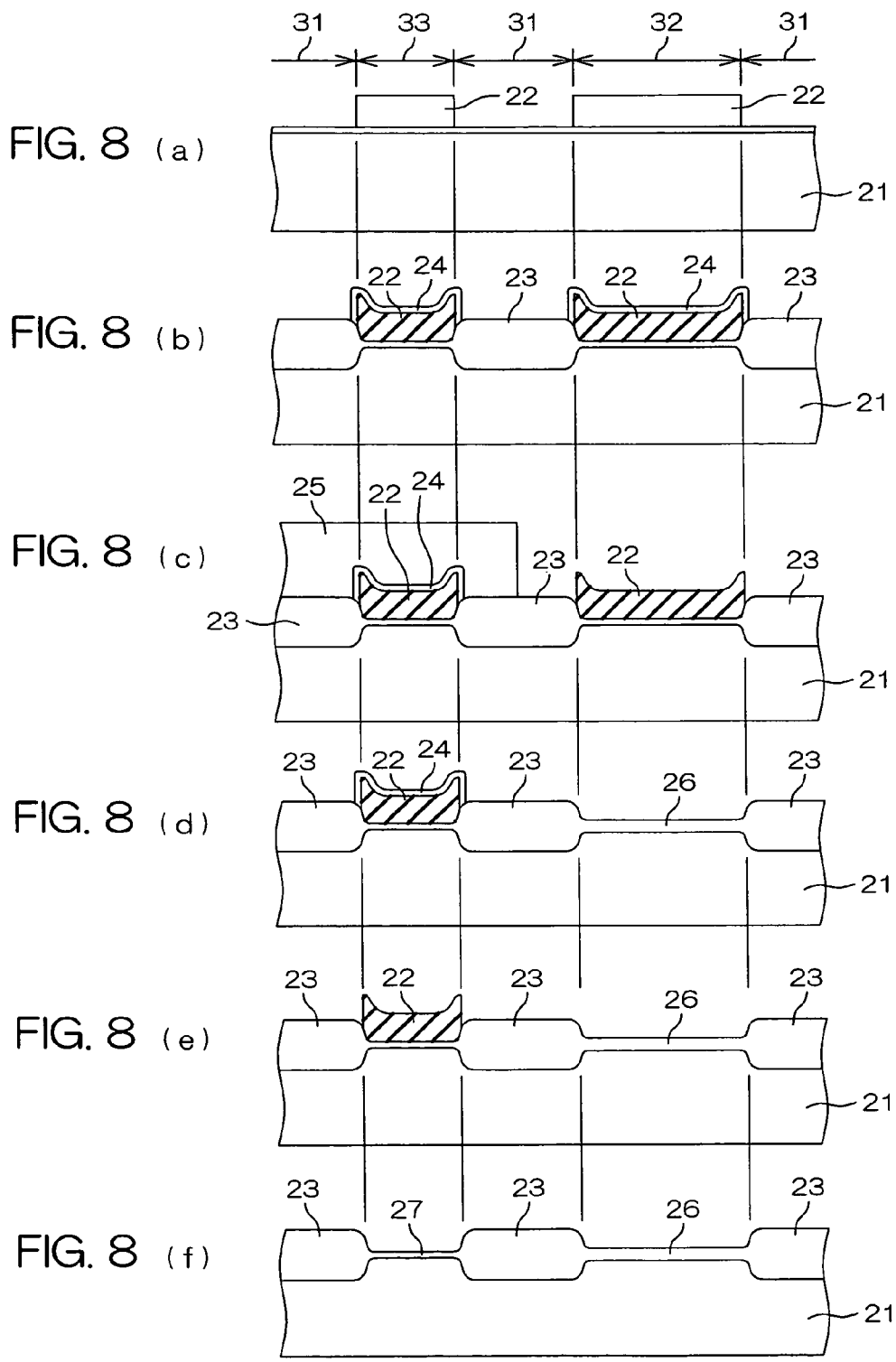
FIGS. 8(a) to 8(f) are schematic sectional views for briefly explaining an inventive method by way of example.
Figure 9:
FIGS. 9(a) to 9(h) are schematic sectional views for briefly explaining a semiconductor device production method according to the present invention.
Figure 9:
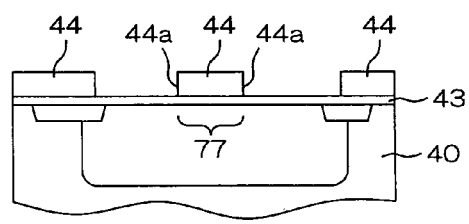
Figure 9:
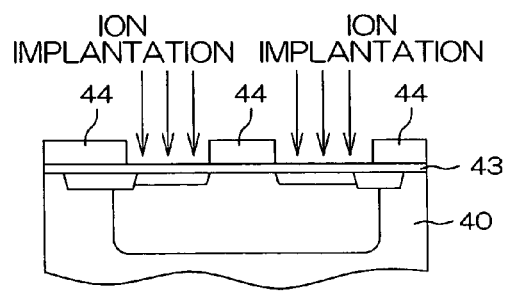
Figure 9:
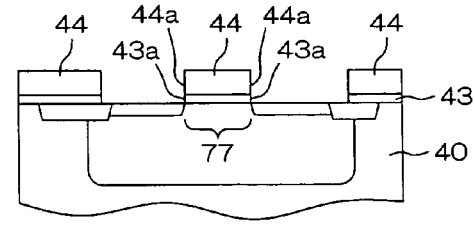
Figure 9:
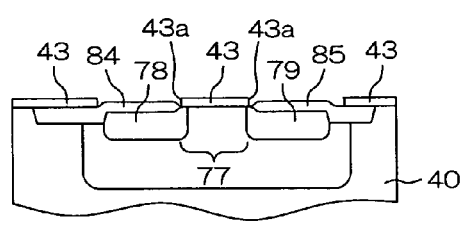
Figure 9:
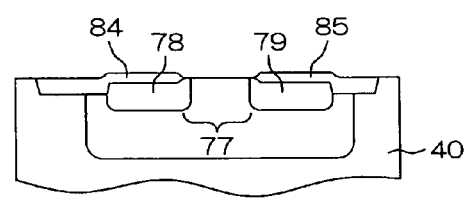
Figure 9:
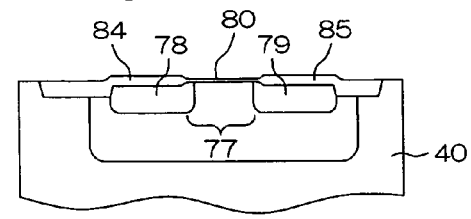
Figure 9:
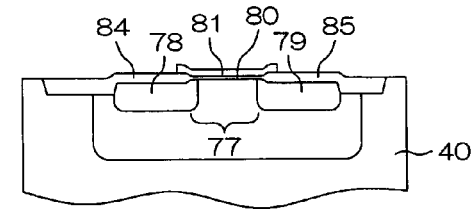
Figure 10:
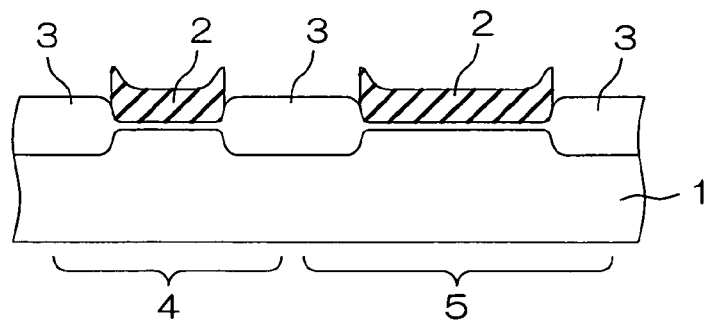
FIGS. 10(a) to 10(d) are schematic sectional views illustrating the steps of a prior art process employing a LOCOS method.
Figure 10:
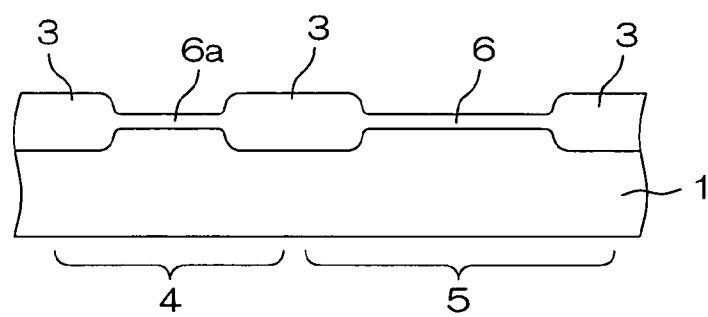
Figure 10:
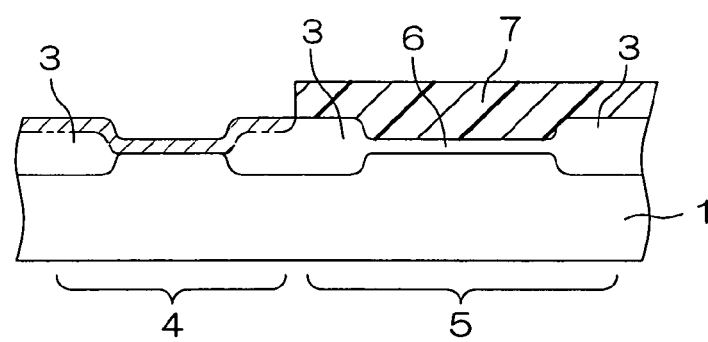
Figure 10:
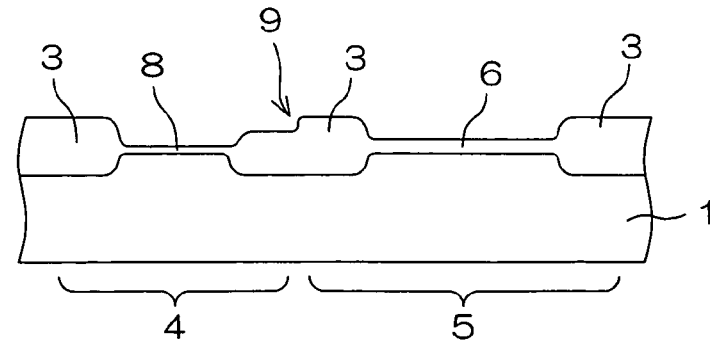
Figure 11:
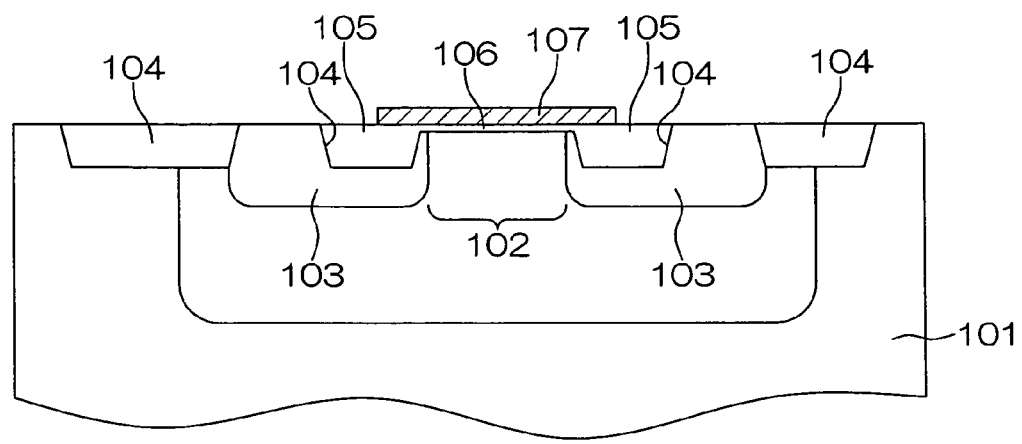
FIG. 11 is a schematic sectional view for explaining the construction of a semiconductor device having a transistor of a drift drain structure.
Figure 12:
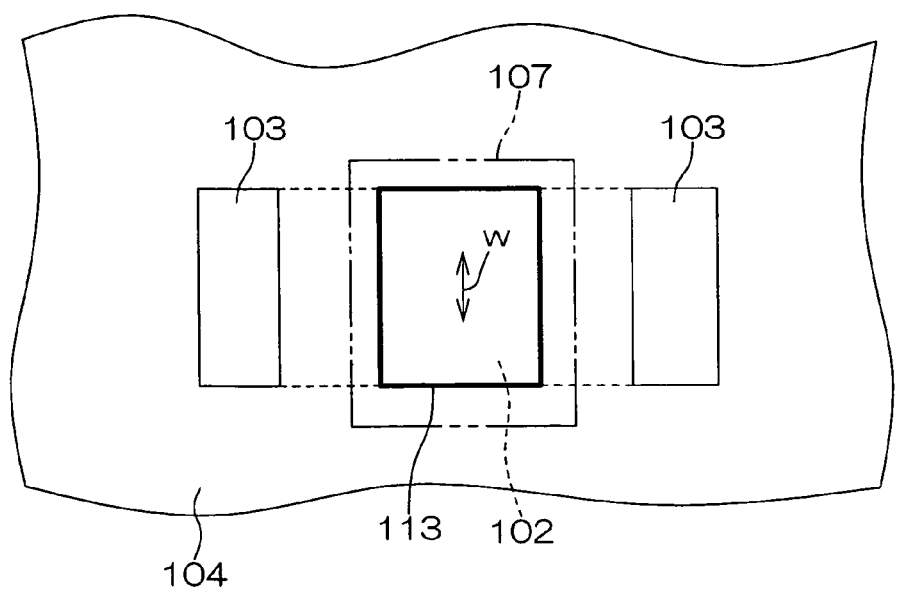
FIG. 12 is a schematic plan view of the semiconductor device of FIG. 11.
Figure 13A:
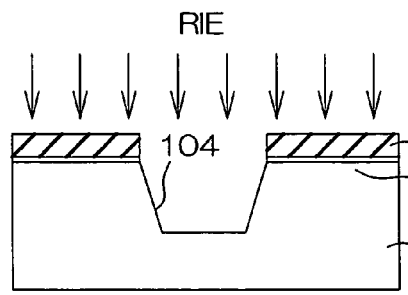
FIGS. 13(a) to 13(f) are schematic sectional views for explaining a production method for the semiconductor device of FIGS. 11 and 12.
Figure 13B:
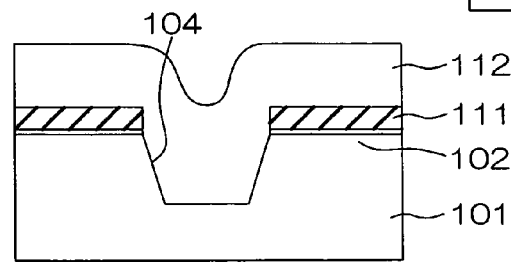
Figure 13C:
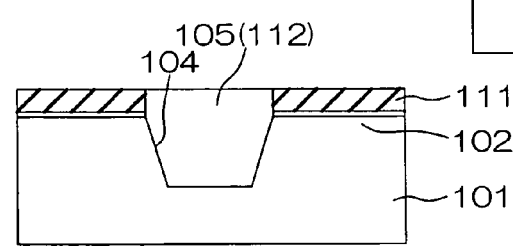
Figure 13D:
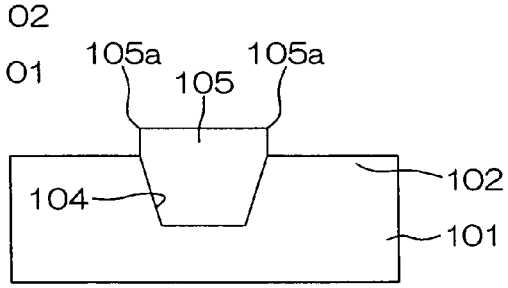
Figure 13E:
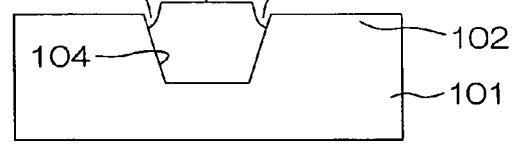
Figure 13F:
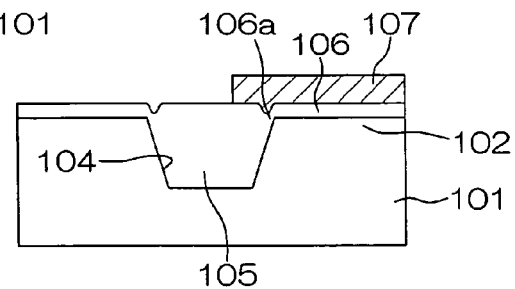
Figure 14:
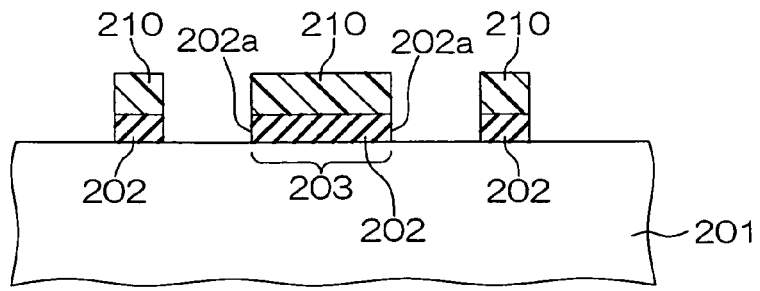
FIGS. 14(a) to 14(d) are sectional views illustrating the steps of a prior art production method for the semiconductor device having the transistor of the drift drain structure.
Figure 14:
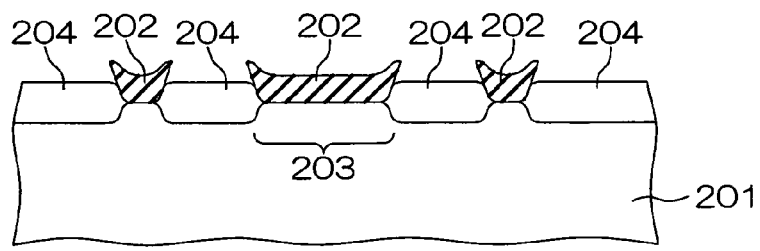
Figure 14:
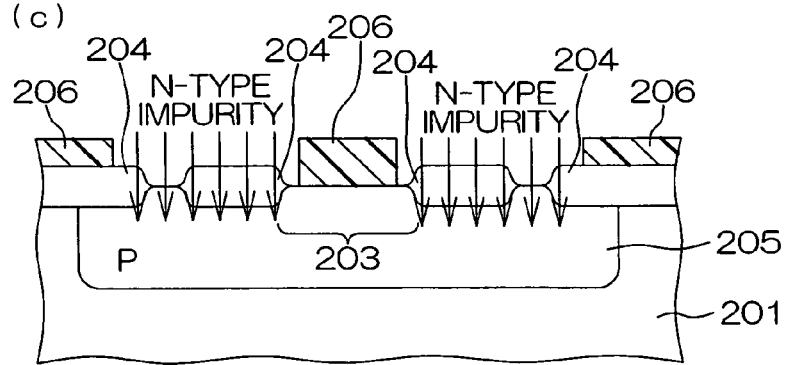
Figure 14:
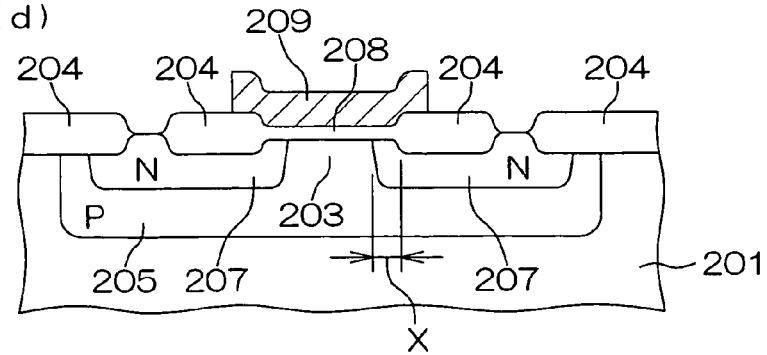
Figure 15:
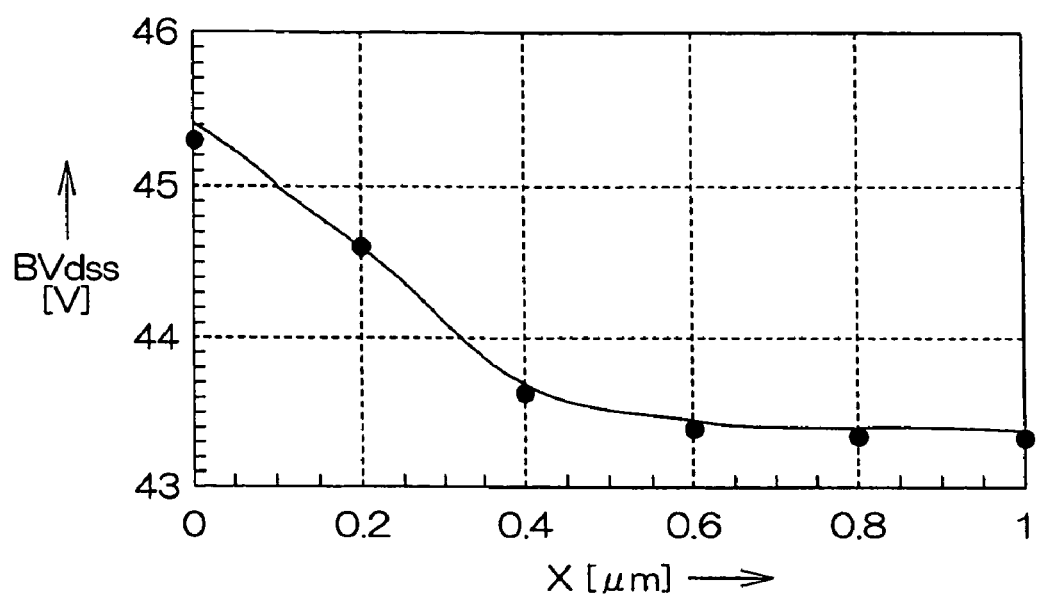
FIG. 15 is a diagram for explaining a variation in the breakdown voltage of the transistor of the drift drain structure produced by the prior art production method.

FIG. 7 is a schematic sectional view for explaining the construction of a semiconductor device according to another embodiment of the present invention. In FIG. 7, parts corresponding to those shown in FIG. 1 will be denoted by the same reference characters as in FIG. 1.

In this embodiment, the device formation regions in the second region 70 are isolated not by the STI portion 72 but by a LOCOS oxide film 98. The higher breakdown voltage transistors 71 in the second region 70 defined as the higher breakdown voltage region each have a greater size, whereby the STI method is not necessarily employed for the isolation thereof. Therefore, the isolation of the device formation regions 73 in the second region 70 may be achieved by the LOCOS method as in this embodiment. Further, the LOCOS oxide film 98 present on a boundary between the first and second regions 50, 70 is free from a significant step.

While two embodiments of the present invention have thus been described, the invention may be embodied in other ways. For example, the LOCOS method may be employed for the device isolation in both of the first and second regions 50, 70. Even in this case, the LOCOS oxide film 98 present on the boundary between the first and second regions 50, 70 is free from the significant step as described above.

In the embodiments described above, the thick oxide films disposed at the edge of the gate electrode 81 for the drift drain structure are defined by the LOCOS oxide films 84, 85 by way of example. The present invention is also applicable to a case in which the thick oxide films are defined by STI portions. That is, the STI portions are provided instead of the LOCOS oxide films 84, 85, and an edge of the gate electrode 81 is located on the STI portions. In this case, the thermal oxidation process is performed with the silicon nitride film 43 patterned as protruding by the very small distance on the STI portions before the formation of the gate oxide film 80, whereby the bird's beaks are formed as extending from the STI portions to the channel region 77. Thus, the STI portions are free from recesses which may otherwise be formed on upper edges thereof.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application Nos. 2004-237207, 2004-237208, 2004-237209, 2004-237210 and 2004-237211 filed with the Japanese Patent Office on Aug. 17, 2004, the disclosure of which is incorporated herein by reference.

What is claimed is:

1. A semiconductor device comprising:
a semiconductor substrate;
a first region defined on the semiconductor substrate and having a first device formation region isolated by a device isolation portion having an STI structure formed by filling an insulator in a trench formed in the semiconductor substrate, wherein a surface of the insulator of the STI structure and a surface of the semiconductor substrate are both arranged in a common plane;
a first device provided in the first device formation region;
a second region defined on the semiconductor substrate conterminously to the first region and having a second device formation region defined in a well; and
a second device provided in the second device formation region and having a higher breakdown voltage than the first device, the second device having a drift drain structure in which a LOCOS oxide film thicker than a gate insulation film thereof is disposed at an edge of a gate electrode thereof, wherein
the device isolation portion includes, at a boundary between the first region and the second region, the STI structure in contact with the first region and the LOCOS oxide film in contact with the second region,
the insulator of the STI structure and the LOCOS oxide film are continuous at the boundary between the first region and the second region, and
the STI structure at the boundary has a trench that extends from the first region to an end portion of the well with a uniform depth.

2. A semiconductor device as set forth in claim 1, wherein the second device formation region is a region isolated by a device isolation portion formed by filling an insulator in a trench formed in the semiconductor substrate.

3. A semiconductor device as set forth in claim 1, wherein the first device has a smaller device size than the second device.

4. The semiconductor device according to claim 1, wherein the second region has a plurality of the second device formation regions isolated by a second device isolation portion including an STI portion formed by filling an insulator in a trench formed in the semiconductor substrate, and a LOCOS portion in contact with the second device.

5. The semiconductor device according to claim 4, wherein the insulator of the STI portion is continuous with the LOCOS portion.

* * * * *